/

US010670787B2

(12) United States Patent
Kasai et al.

(10) Patent No.: US 10,670,787 B2
(45) Date of Patent: Jun. 2, 2020

(54) LIQUID CRYSTAL CURED FILM, OPTICAL FILM INCLUDING THE LIQUID CRYSTAL CURED FILM, AND DISPLAY DEVICE

(71) Applicant: SUMITOMO CHEMICAL COMPANY, LIMITED, Tokyo (JP)

(72) Inventors: Tatsuaki Kasai, Osaka (JP); Nobuyuki Hatanaka, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 146 days.

(21) Appl. No.: 15/216,550

(22) Filed: Jul. 21, 2016

(65) Prior Publication Data

US 2017/0022416 A1 Jan. 26, 2017

(30) Foreign Application Priority Data

Jul. 24, 2015 (JP) .................................. 2015-147142

(51) Int. Cl.
| | |
|---|---|
| *C09K 19/38* | (2006.01) |
| *G02B 5/30* | (2006.01) |
| *C09K 19/34* | (2006.01) |
| *H01L 51/52* | (2006.01) |
| *C09K 19/04* | (2006.01) |

(52) U.S. Cl.
CPC ........ *G02B 5/3016* (2013.01); *C09K 19/3497* (2013.01); *C09K 19/3852* (2013.01); *C09K 2019/0448* (2013.01); *H01L 51/5281* (2013.01); *Y10T 428/10* (2015.01); *Y10T 428/1036* (2015.01)

(58) Field of Classification Search
CPC ...... G02B 5/3016; G02B 5/3083; G02B 5/32; C09K 19/3809; C09K 19/3833; C09K 19/3838; C09K 19/542; C09K 2019/2078; C09K 2019/0448; G02F 1/13363; G02F 1/133632; G02F 1/133634; Y10T 428/10; Y10T 428/1036; Y10T 428/1045; Y10T 428/105
USPC ........ 428/1.1, 1.3, 1.32, 1.33; 349/117, 118, 349/194, 121; 252/299.64–299.68
See application file for complete search history.

(56) References Cited

U.S. PATENT DOCUMENTS

| | | | | |
|---|---|---|---|---|
| 2012/0056129 | A1* | 3/2012 | Hasebe | ..................... C08F 2/48 252/299.5 |
| 2015/0041051 | A1 | 2/2015 | Kobayashi | |
| 2015/0043072 | A1 | 2/2015 | Sase et al. | |
| 2015/0062505 | A1 | 3/2015 | Hatanaka et al. | |
| 2015/0108401 | A1 | 4/2015 | Harai et al. | |
| 2015/0218453 | A1 | 8/2015 | Kobayashi et al. | |

FOREIGN PATENT DOCUMENTS

| | | |
|---|---|---|
| CN | 102863967 A | 1/2013 |
| CN | 104339796 A | 2/2015 |
| JP | 2007-334206 A | 12/2007 |
| JP | 2010-262098 A | 11/2010 |
| JP | 2011-2556 A | 1/2011 |
| JP | 2011-79984 A | 4/2011 |
| JP | 2011207765 A * | 10/2011 |
| JP | 2012-21068 A | 2/2012 |
| JP | 2013-33248 A | 2/2013 |
| JP | 2014-222282 A | 11/2014 |
| JP | 2014-222283 A | 11/2014 |
| JP | 2015-7700 A | 1/2015 |
| JP | 2015-57647 A | 3/2015 |
| JP | 2015-69157 A | 4/2015 |
| JP | 2015-143786 A | 8/2015 |
| JP | 2015-163934 A | 9/2015 |
| TW | 201335706 A1 | 9/2013 |

OTHER PUBLICATIONS

U.S. Office Action for U.S. Appl. No. 15/216,462, dated Jul. 31, 2018.
Japanese Notification of Reasons for Refusal for Japanese Application No. 2016-145787, dated Nov. 27, 2018, with English translation.
U.S. Final Office Action for U.S. Appl. No. 15/216,462, dated Nov. 30, 2018.
Japanese Office Action for Japanese Application No. 2016-145787, dated Apr. 2, 2019, with partial English translation.
U.S. Office Action for U.S. Appl. No. 15/216,462, dated May 3, 2019.
Chinese Office Action and Search Report for Chinese Application No. 201610586871.X, dated Jul. 10, 2019, with partial English translation.
U.S. Office Action, dated Aug. 26, 2019, for U.S. Appl. No. 15/216,462.
Chinese Office Action and Search Report for Chinese Patent Application No. 201610580113.2, dated Sep. 9, 2019, with a partial English translation.
Taiwanese Office Action and Search Report, dated Nov. 25, 2019, for Taiwanese Application No. 105123203, with English translations.
Taiwanese Office Action and Search Report (including an English translation thereof) issued in Taiwanese Patent Application No. 105123205 dated Mar. 26, 2020.
Japanese Office Action (including an English translation thereof) issued in Japanese Patent Application No. 2016-145787 dated Apr. 7, 2020.

(Continued)

*Primary Examiner* — Ruiyun Zhang
(74) *Attorney, Agent, or Firm* — Birch, Stewart, Kolasch & Birch, LLP

(57) ABSTRACT

As a liquid crystal cured film that is small in amount of decrease in phase difference value which decrease is caused in a case where the liquid crystalline cured film is exposed to a high-temperature environment, provided is a liquid crystal cured film containing a polymerizable liquid crystal compound that is polymerized, the liquid crystal cured film having a maximum absorption at a wavelength in a range of not less than 300 nm and not more than 380 nm, and satisfying the following Formula (Y): $(1-P'/P0) \times 100 \geq 73 \ldots$ (Y).

9 Claims, No Drawings

(56) References Cited

OTHER PUBLICATIONS

Ohwa, "Recent Aspects in Photoinitiators." Journal of Printing Science and Technology. The Japanese Society of Printing Science and Technology, vol. 40, No. 3, pp. 168-175 (17 pages total; including an English translation thereof).

* cited by examiner

LIQUID CRYSTAL CURED FILM, OPTICAL FILM INCLUDING THE LIQUID CRYSTAL CURED FILM, AND DISPLAY DEVICE

This Nonprovisional application claims priority under 35 U.S.C. § 119 on Patent Application No. 2015-147142 filed in Japan on Jul. 24, 2015, the entire contents of which are hereby incorporated by reference.

TECHNICAL FIELD

The present invention relates to a liquid crystal cured film, an optical film including the liquid crystal cured film, and a display device. More specifically, the present invention relates to a liquid crystal cured film, an optical film including the liquid crystal cured film, a circularly polarizing plate including the liquid crystal cured film or the optical film, and a display device including the circularly polarizing plate.

BACKGROUND ART

A touch panel display device such as a flat panel display device (FPD) is composed of members each including an optical film, such as a polarizing plate and a wave plate. As such an optical film, there is known an optical film including a liquid crystal cured film that is made of a composition for liquid crystal cured film formation which composition contains a polymerizable liquid crystal compound. Patent Literature 1 discloses an optical film including a liquid crystal cured film that exhibits reciprocal wavelength dispersibility.

CITATION LIST

Patent Literature

Patent Literature 1

Japanese Patent Application Publication, Tokukai, No. 2012-021068 (Publication date: Feb. 2, 2012)

SUMMARY OF INVENTION

Technical Problem

A conventional liquid crystal cured film that is made of a composition for liquid crystal cured film formation has a problem of a decrease in phase difference value when exposed to a high-temperature environment.

Solution to Problem

In order to solve the problem, the present invention provides the following [1] through [18]:

[1]
A liquid crystal cured film containing a polymerizable liquid crystal compound that is polymerized,
the liquid crystal cured film having a maximum absorption at a wavelength in a range of not less than 300 nm and not more than 380 nm, and satisfying the following Formula (Y):

$$(1-P'/P0) \times 100 \geq 73 \quad (Y)$$

wherein: P' represents a P value of a surface which has a smaller P value among P values of two surfaces which are perpendicular to a thickness direction of the liquid crystal cured film; P0 represents the P value of the polymerizable liquid crystal compound; and the P value is represented by $I(1)/I(2)$, wherein $I(1)$ represents a peak intensity derived from in-plane deformation vibration of an ethylenic unsaturated bond obtained by infrared total reflection absorption spectrum measurement and $I(2)$ represents a peak intensity derived from stretching vibration of an unsaturated bond of an aromatic ring obtained by the infrared total reflection absorption spectrum measurement.

[2]
The liquid crystal cured film as set forth in [1], wherein the liquid crystal cured film satisfies the following Formula (3):

$$100 \text{ nm} < Re(550) < 160 \text{ nm} \quad (3)$$

wherein Re(550) represents an in-plane phase difference value with respect to light having a wavelength of 550 nm.

[3]
The liquid crystal cured film as set forth in [1], wherein the liquid crystal cured film satisfies the following Formulae (1) and (2):

$$Re(450)/Re(550) \leq 1.00 \quad (1)$$

$$1.00 \leq Re(650)/Re(550) \quad (2)$$

wherein: Re(450) represents an in-plane phase difference value with respect to light having a wavelength of 450 nm; Re(550) represents an in-plane phase difference value with respect to light having a wavelength of 550 nm; and Re(650) represents an in-plane phase difference value with respect to light having a wavelength of 650 nm.

[4]
The liquid crystal cured film as set forth in [1], wherein the polymerizable liquid crystal compound has a maximum absorption at wavelength $\lambda_{max}(LC)$ that satisfies the following:

$$300 \text{ nm} \leq \lambda_{max}(LC) \leq 380 \text{ nm}$$

[5]
The liquid crystal cured film as set forth in [1], further containing a photopolymerization initiator composition.

[6]
The liquid crystal cured film as set forth in [5], wherein the photopolymerization initiator composition has a maximum absorption at wavelength $\lambda(A)$ and a maximum absorption at wavelength $\lambda(B)$ and these maximum absorptions at wavelength $\lambda(A)$ and $\lambda(B)$ satisfy the following:

$$\lambda(A) < \lambda(B)$$

[7]
The liquid crystal cured film as set forth in [6], wherein the maximum absorption at the wavelength of the photopolymerization initiator composition and the maximum absorption at the wavelength of the polymerizable liquid crystal compound satisfy the following:

$$20 \text{ nm} < \lambda(B) - \lambda_{max}(LC) \text{ or}$$

$$20 \text{ nm} < \lambda_{max}(LC) - \lambda(A)$$

[8]
The liquid crystal cured film as set forth in [5], wherein the liquid crystal cured film contains the photopolymerization initiator composition in an amount of 1 part by mass to 20 parts by mass relative to 100 parts by mass of the polymerizable liquid crystal compound.

[9]
The liquid crystal cured film as set forth in [5], wherein the photopolymerization initiator composition contains a photopolymerization initiator that has an oxime structure in a molecule thereof.

[10]

The liquid crystal cured film as set forth in [1], wherein the liquid crystal cured film is obtained by curing a composition containing the polymerizable liquid crystal compound and a photopolymerization initiator composition.

[11]

The liquid crystal cured film as set forth in [10], wherein the photopolymerization initiator composition has a maximum absorption at wavelength λ(A) and a maximum absorption wavelength λ(B) and these maximum absorptions at wavelength λ(A) and λ(B) satisfy the following:

$$\lambda(A)<\lambda(B)$$

[12]

The liquid crystal cured film as set forth in [11], wherein the maximum absorption at the wavelength of the photopolymerization initiator composition and the maximum absorption at the wavelength of the polymerizable liquid crystal compound satisfy the following:

$$20\text{ nm}<\lambda(B)-\lambda_{max}(LC) \text{ or}$$

$$20\text{ nm}<\lambda_{max}(LC)-\lambda(A)$$

[13]

The liquid crystal cured film as set forth in [10], wherein the liquid crystal cured film contains the photopolymerization initiator composition in an amount of 1 part by mass to 20 parts by mass relative to 100 parts by mass of the polymerizable liquid crystal compound.

[14]

The liquid crystal cured film as set forth in [10], wherein the photopolymerization initiator composition contains a photopolymerization initiator that has an oxime structure in a molecule thereof.

[15]

An optical film including a liquid crystal cured film recited in any one of [1] through [14].

[16]

A circularly polarizing plate including:

a liquid crystal cured film recited in any one of [1] through [14]; and a polarizing plate.

[17]

An organic electroluminescent (EL) display device including a liquid crystal cured film recited in any one of [1] through [14].

[18]

A touch panel display device including a liquid crystal cured film recited in any one of [1] through [14].

Advantageous Effects of Invention

A liquid crystalline cured film in accordance with the present invention yields an effect of reducing an amount of decrease in phase difference value which decrease is caused in a case where the liquid crystalline cured film is exposed to a high-temperature environment.

DESCRIPTION OF EMBODIMENTS

An embodiment of the present invention is specifically described below. Note that "A to B" herein refers to "not less than A and not more than B".

Embodiment 1: Liquid Crystal Cured Film

[Liquid Crystal Cured Film]

The present invention can be a liquid crystal cured film containing a polymerizable liquid crystal compound that is polymerized, the liquid crystal cured film having a maximum absorption at a wavelength in a range of not less than 300 nm and not more than 380 nm, and satisfying the following Formula (Y):

$$(1-P'/P0)\times 100 \geq 73 \tag{Y}$$

wherein: P' represents a P value of a surface which has a smaller P value among P values of two surfaces which are perpendicular to a thickness direction of the liquid crystal cured film; P0 represents the P value of the polymerizable liquid crystal compound; and the P value is represented by I(1)/I(2), wherein I(1) represents a peak intensity derived from in-plane deformation vibration of an ethylenic unsaturated bond obtained by infrared total reflection absorption spectrum measurement and I(2) represents a peak intensity derived from stretching vibration of an unsaturated bond of an aromatic ring obtained by the infrared total reflection absorption spectrum measurement.

As shown above, the P value refers to a ratio of the peak intensity (I(1)) derived from in-plane deformation vibration of an ethylenic unsaturated bond to the peak intensity (I(2)) derived from stretching vibration of an unsaturated bond of an aromatic ring in infrared total reflection absorption spectrum measurement. During curing (polymerization) of the polymerizable liquid crystal compound, the unsaturated bond of the aromatic ring is unreactive, whereas the ethylenic unsaturated bond disappears. Thus, by finding the P value in which the peak intensity of the unreactive unsaturated bond of the aromatic ring is a relative reference, it is possible to calculate an amount of the ethylenic unsaturated bond contained in the liquid crystal cured film. This makes it possible to calculate, based on Formula (Y), a degree of polymerization of the liquid crystal cured film formed by polymerization of the polymerizable liquid crystal compound.

A value calculated based on Formula (Y) is not less than 73, preferably not less than 83. The value calculated based on Formula (Y) is preferably a high numerical value provided that the value does not cause a decrease in phase difference value even in a case where the liquid crystal cured film is exposed to a high-temperature environment. The value calculated based on Formula (Y) can have an upper limit value of less than 97 or not more than 93.

The value calculated based on Formula (Y) preferably falls within the above range in terms of a reduction in amount of decrease (amount of change) in phase difference value which decrease is caused in a case where the liquid crystal cured film is heated to a high temperature.

[Polymerizable Liquid Crystal Compound]

A polymerizable liquid crystal compound serving as a material of which a liquid crystal cured film of the present invention is to be made is a polymerizable liquid crystal compound that has a maximum absorption at wavelength $\lambda_{max}(LC)$ preferably of not less than 300 nm and not more than 380 nm, more preferably of not less than 330 nm and not more than 380 nm, and still more preferably of not less than 330 nm and not more than 360 nm.

Further, a polymerizable liquid crystal compound is a compound that has a polymerizable group and has liquid crystallinity. The polymerizable group, which means a group that is involved in a polymerization reaction, is preferably a photopolymerizable group. Note here that the photopolymerizable group refers to a group that can be involved in a polymerization reaction by, for example, an active radical or an acid generated from a photopolymerization initiator.

Examples of the photopolymerizable group include a vinyl group, a vinyloxy group, a 1-chlorovinyl group, an isopropenyl group, a 4-vinylphenyl group, an acryloyloxy group, a methacryloyloxy group, an oxiranyl group, an oxetanyl group, and the like. Of these polymerizable groups, a vinyloxy group, an acryloyloxy group, a methacryloyloxy group, an oxiranyl group, and an oxetanyl group are preferable, and an acryloyloxy group is more preferable. Liquid crystallinity can be achieved by thermotropic liquid crystal or lyotropic liquid crystal. Note, however, that liquid crystallinity is preferably achieved by thermotropic liquid crystal in terms of allowing a thickness of the liquid crystal cured film to be closely controlled. Alternatively, liquid crystallinity can also be achieved by nematic liquid crystal or smectic liquid crystal of thermotropic liquid crystal. From the viewpoint of easiness of production, liquid crystallinity is preferably achieved by nematic liquid crystal of thermotropic liquid crystal.

In terms of allowing the liquid crystal cured film to exhibit reciprocal wavelength dispersibility (described earlier), the polymerizable liquid crystal compound is particularly preferably a polymerizable liquid crystal compound having a structure represented by the following Formula (I):

L-G-D-Ar-D-G-L    (I)

where Ar represents a substituted or unsubstituted bivalent aromatic group. This aromatic group refers to a group which has planarity and a ring structure whose pi electron number is [4n+2] in accordance with Hückel rule where n represents an integer. In a case where the ring structure includes heteroatoms such as —N= and —S—, (i) a non-covalently bonded electron pair on these heteroatoms and (ii) pi electrons in the ring structure satisfy the Hückel rule. Such a case also encompasses a case where the ring structure has aromaticity. The bivalent aromatic group preferably contains at least one atom selected from the group consisting of a nitrogen atom, an oxygen atom, and a sulfur atom.

Two Ds are each independently a single bond or a bivalent linking group.

Two Gs each independently represent a bivalent alicyclic hydrocarbon group.

Two Ls each independently represent a monovalent organic group, and at least one of the two Ls has a polymerizable group.

Ar preferably has at least one selected from a substituted or unsubstituted aromatic hydrocarbon ring, a substituted or unsubstituted heteroaromatic ring, and an electron-withdrawing group. The aromatic hydrocarbon ring, which is exemplified by a benzene ring, a naphthalene ring, an anthracene ring, and the like, is preferably a benzene ring or a naphthalene ring. Examples of the heteroaromatic ring include a furan ring, a benzofuran ring, a pyrrole ring, an indole ring, a thiophene ring, a benzothiophene ring, a pyridine ring, a pyrazine ring, a pyrimidine ring, a triazole ring, a triazine ring, a pyrroline ring, an imidazole ring, a pyrazole ring, a thiazole ring, a benzothiazole ring, a thienothiazole ring, an oxazole ring, a benzoxazole ring, a phenanthroline ring, and the like. Of these heteroaromatic rings, Ar preferably has a thiazole ring, a benzothiazole ring, or a benzofuran ring, and more preferably has a benzothiazole ring. In a case where Ar contains a nitrogen atom, the nitrogen atom preferably has a pi electron.

In Formula (I), a total number $N\pi$ of pi electrons contained in the bivalent aromatic group represented by Ar is preferably not less than 8, more preferably not less than 10, still more preferably not less than 14, and particularly preferably not less than 16. Further, the total number $M\pi$ is preferably not more than 30, more preferably not more than 26, and still more preferably not more than 24.

Examples of the aromatic group represented by Ar include the following groups:

[Chem. 1]

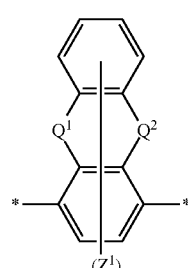

(Ar-1)

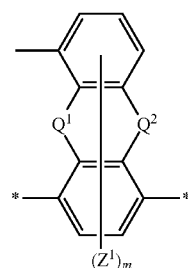

(Ar-2)

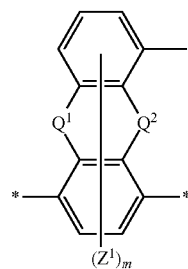

(Ar-3)

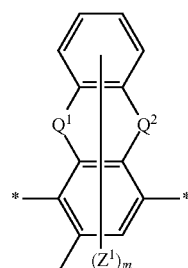

(Ar-4)

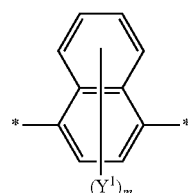

(Ar-5)

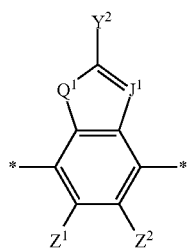
(Ar-6)
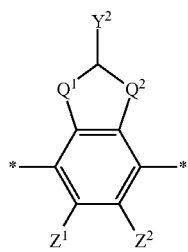
(Ar-7)
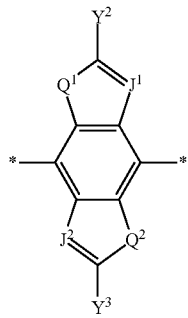
(Ar-8)
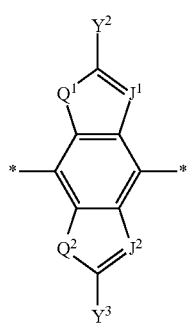
(Ar-9)
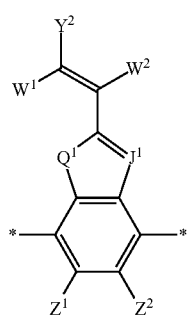
(Ar-10)
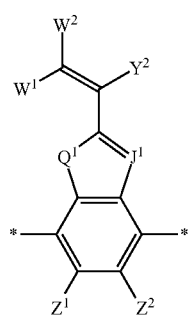
(Ar-11)
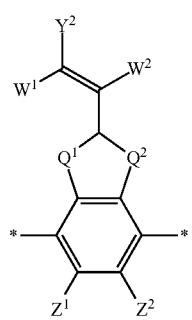
(Ar-12)
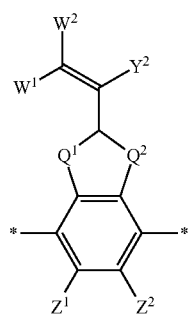
(Ar-13)
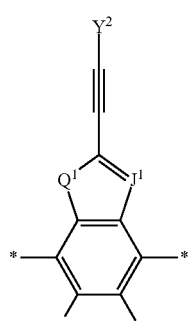
(Ar-14)
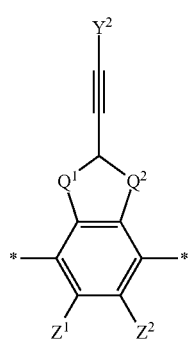
(Ar-15)

-continued

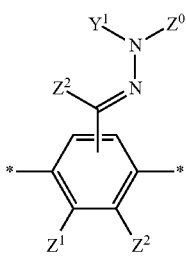
(Ar-16)

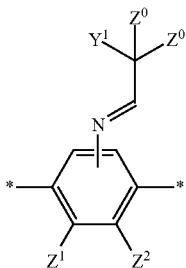
(Ar-17)

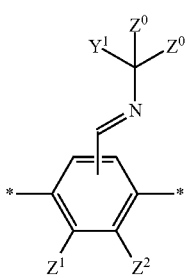
(Ar-18)

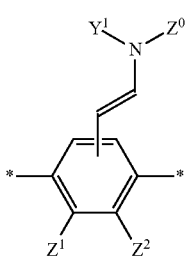
(Ar-19)

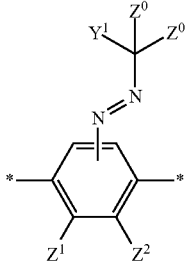
(Ar-20)

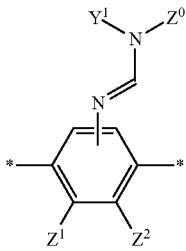
(Ar-21)

-continued

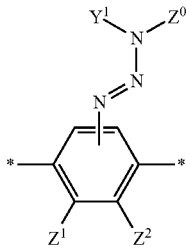
(Ar-22)

In Formulae (Ar-1) through (Ar-22), an asterisk * represents a connection, and $Z^0$, $Z^1$, and $Z^2$ each independently represent a hydrogen atom, a halogen atom, a C1-C12 alkyl group, a cyano group, a nitro group, a C1-C12 alkylsulfinyl group, a C1-C12 alkylsulfonyl group, a carboxyl group, a C1-C12 fluoroalkyl group, a C1-C6 alkoxy group, a C1-C12 alkylthio group, a C1-C12 N-alkylamino group, a C2-C12 N,N-dialkylamino group, a C1-C12 N-alkylsulfamoyl group, or a C2-C12 N,N-dialkylsulfamoyl group.

$Q^1$, $Q^2$, and $Q^3$ each independently represent $-CR^{2'}R^{3'}-$, $-S-$, $-NH-$, $-NR^{2'}-$, $-CO-$, or $-O-$, and $R^{2'}$ and $R^{3'}$ each independently represent a hydrogen atom or a C1-C4 alkyl group.

$J^1$ and $J^2$ each independently represent a carbon atom or a nitrogen atom.

$Y^1$, $Y^2$, and $Y^3$ each independently represent a substituted or unsubstituted aromatic hydrocarbon group or a substituted or unsubstituted heteroaromatic ring group.

$W^1$ and $W^2$ each independently represent a hydrogen atom, a cyano group, a methyl group, or a halogen atom, and m is an integer of 0 to 6.

Examples of the aromatic hydrocarbon group in $Y^1$, $Y^2$, and $Y^3$ include C6-C20 aromatic hydrocarbon groups such as a phenyl group, a naphthyl group, an anthryl group, a phenanthryl group, and a biphenyl group. Of these aromatic hydrocarbon groups, a phenyl group or a naphthyl group is preferable, and a phenyl group is more preferable. Examples of the heteroaromatic ring group in $Y^1$, $Y^2$, and $Y^3$ include C4-C20 heteroaromatic ring groups, each containing at least one heteroatom such as a nitrogen atom, an oxygen atom, or a sulfur atom, such as a furyl group, a pyrrolyl group, a thienyl group, a pyridinyl group, a thiazolyl group, and benzothiazolyl group. Of these heteroaromatic ring groups, a furyl group, a thienyl group, a pyridinyl group, a thiazolyl group, or a benzothiazolyl group is preferable.

$Y^1$, $Y^2$, and $Y^3$ can be each independently a substituted or unsubstituted polycyclic aromatic hydrocarbon group or a substituted or unsubstituted polycyclic heteroaromatic ring group. A polycyclic aromatic hydrocarbon group refers to a condensed polycyclic aromatic hydrocarbon group or a group derived from an aromatic ring assembly. A polycyclic heteroaromatic ring group refers to a condensed polycyclic heteroaromatic ring group or a group derived from an aromatic ring assembly.

It is preferable that $Z^0$, $Z^1$, and $Z^2$ be each independently a hydrogen atom, a halogen atom, a C1-C6 alkyl group, a cyano group, a nitro group, or a C1-C12 alkoxy group. It is more preferable that $Z^0$ be a hydrogen atom, a C1-C12 alkyl group, or a cyano group. It is still more preferable that $Z^1$ and $Z^2$ be each a hydrogen atom, a fluorine atom, a chlorine atom, a methyl group, or a cyano group.

$Q^1$, $Q^2$, and $Q^3$ are each preferably $-NH-$, $-S-$, $-NR^{2'}-$, or $-O-$, and $R^{2'}$ is preferably a hydrogen atom.

Of —NH—, —S—, —NR²—, and —O—, —S—, —O—, or —NH— is particularly preferable.

Of Formulae (Ar-1) through (Ar-22), Formulae (Ar-6) and (Ar-7) are preferable from the viewpoint of molecular stability.

In Formulae (Ar-16) through (Ar-22), together with $Z^0$ and a nitrogen atom to which $Y^1$ is bound, $Y^1$ can form a heteroaromatic ring group. Examples of the heteroaromatic ring group, which is exemplified by the heteroaromatic rings (mentioned earlier), each of which Ar can have, include a pyrrole ring, an imidazole ring, a pyrroline ring, a pyridine ring, a pyrazine ring, a pyrimidine ring, an indole ring, a quinoline ring, an isoquinoline ring, a purine ring, a pyrrolidine ring, and the like. The heteroaromatic ring group can have a substituent. Further, together with $Z^0$ and a nitrogen atom to which $Y^1$ is bound, $Y^1$ can be a substituted or unsubstituted polycyclic aromatic hydrocarbon group (described earlier) or a substituted or unsubstituted polycyclic heteroaromatic ring group (described earlier). Examples of the substituted or unsubstituted polycyclic aromatic hydrocarbon group or the substituted or unsubstituted polycyclic heteroaromatic ring group include a benzofuran ring, a benzothiazole ring, a benzoxazole ring, and the like.

The polymerizable liquid crystal compound is preferably, for example, a compound represented by the following Formula (A) (hereinafter also referred to as a compound (A)). Polymerizable liquid crystal compounds can be used in only one kind or in combination of two or more kinds. In a case where two or more kinds of polymerizable liquid crystal compounds are used in combination, at least one kind of the two or more kinds of polymerizable liquid crystal compounds is preferably the compound (A), and each of at least two kinds of the two or more kinds of polymerizable liquid crystal compounds is more preferably the compound (A).

[Chem. 2]

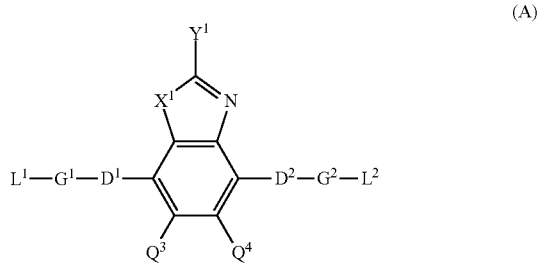

(A)

wherein: $X^1$ represents an oxygen atom, a sulfur atom, or —NR¹—; $R^1$ represents a hydrogen atom or a C1-C4 alkyl group; $Y^1$ represents a substituted or unsubstituted C6-C12 monovalent aromatic hydrocarbon group, or a substituted or unsubstituted C3-C12 monovalent aromatic heterocyclic group; $Q^3$ and $Q^4$ each independently represent a hydrogen atom, a substituted or unsubstituted C1-C20 monovalent aliphatic hydrocarbon group, a C3-C20 monovalent alicyclic hydrocarbon group, a substituted or unsubstituted C6-C20 monovalent aromatic hydrocarbon group, a halogen atom, a cyano group, a nitro group, —NR²R³, or —SR², or (i) $Q^3$ and (ii) $Q^4$, which are bound together, (iii) a carbon atom to which $Q^3$ is bound, and (iv) a carbon atom to which $Q^4$ is bound form an aromatic ring or a heteroaromatic ring; $R^2$ and $R^3$ each independently represent a hydrogen atom or a C1-C6 alkyl group; $D^1$ and $D^2$ each independently represent a single bond, —C(=O)—O—, —C(=S)—O—, —CR⁴R⁵—, —CR⁴R⁵—CR⁶R⁷—, —O—CR⁴R⁵—, —CR⁴R⁵—O—CR⁶R⁷—, —C(=O)—O—CR⁴R⁵—, —O—C(=O)—CR⁴R⁵—, —CR⁴R⁵—O—C(=O)— CR⁶R⁷—, —CR⁴R⁵—C(=O)—O—CR⁶R⁷—, —NR⁴— CR⁵R⁶—, or —C(=O)—NR⁴—; $R^4$, $R^5$, $R^6$, and $R^7$ each independently represent a hydrogen atom, a fluorine atom, or a C1-C4 alkyl group; $G^1$ and $G^2$ each independently represent a C5-C8 bivalent alicyclic hydrocarbon group whose methylene group can be replaced with an oxygen atom, a sulfur atom, or —NH— and whose methine group can be replaced with a tertiary nitrogen atom; and $L^1$ and $L^2$ each independently represent a monovalent organic group, and at least one of $L^1$ and $L^2$ has a polymerizable group. Note here that the polymerizable group is as described earlier.

$L^1$ in the compound (A) is preferably a group represented by the following Formula (A1), and $L^2$ in the compound (A) is preferably a group represented by the following Formula (A2).

wherein: $B^1$, $B^2$, $E^1$, and $E^2$ each independently represent —CR⁴R⁵—, —CH₂—CH₂—, —O—, —S—, —C(=O)— O—, —O—C(=O)—O—, —CS—O—, —O—C(=S)— O—, —C(=O)—NR¹—, —O—CH₂—, —S—CH₂—, or a single bond; $A^1$ and $A^2$ each independently represent a C5-C8 bivalent alicyclic hydrocarbon group whose methylene group can be replaced with an oxygen atom, a sulfur atom, or —NH— and whose methine group can be replaced with a tertiary nitrogen atom, or a C6-C18 bivalent aromatic hydrocarbon group; k and l each independently represent an integer of 0 to 3; $F^1$ and $F^2$ each independently represent a C1-C12 bivalent aliphatic hydrocarbon group; $P^1$ represents a hydrogen atom or a polymerizable group, and is preferably a polymerizable group; $P^2$ represents a hydrogen atom or a polymerizable group; at least one of $P^1$ and $P^2$ only needs to be a polymerizable group; $R^4$ and $R^5$ each independently represent a hydrogen atom, a fluorine atom, or a C1-C4 alkyl group; and $R^1$ represents a hydrogen atom or a C1-C4 alkyl group.

Preferable examples of the compound (A) include a polymerizable liquid crystal compound disclosed in Published Japanese Translation of PCT International Application, Tokuhyo, No. 2011-207765.

Examples of a polymerizable liquid crystal compound that differs from the compound (A) include a compound that contains a group represented by the following Formula (X) (hereinafter also referred to as a compound (X)):

wherein: $P^{11}$ represents a polymerizable group; $A^{11}$ represents a bivalent alicyclic hydrocarbon group or a bivalent aromatic hydrocarbon group, the bivalent alicyclic hydrocarbon group and the bivalent aromatic hydrocarbon group each contain a hydrogen atom that can be replaced with a halogen atom, a C1-C6 alkyl group, a C1-C6 alkoxy group, a cyano group, or a nitro group, and the C1-C6 alkyl group and the C1-C6 alkoxy group each contain a hydrogen atom that can be replaced with a fluorine atom; $B^{11}$ represents —O—, —S—, —C(=O)—O—, —O—C(=O)—, —O—C(=O)—O—, —C(=O)—NR¹⁶—, —NR¹⁶—C (=O)—, —C(=O)—, —CS—, or a single bond; $R^{16}$ represents a hydrogen atom or a C1-C6 alkyl group; $B^{12}$ and $B^{13}$ each independently represent —CH=CH—, —CH=CH—, —CH₂—CH₂—, —O—, —S—, —C(=O)—, —C(=O)—O—, —O—C(=O)—, —O—C (=O)—O—, —CH=N—, —N=CH—, —N=N—, —C(=O)—NR$^{16}$—, —NR$^{16}$—C(=O)—, —OCH$_2$—, —OCF$_2$—, —CH$_2$O—, —CF$_2$O—, —CH=CH—C (=O)—O—, —O—C(=O)—CH=CH—, or a single bond; and E$^{11}$ represents a C1-C12 alkanediyl group whose hydrogen atom can be replaced with a C1-C5 alkoxy group whose hydrogen atom can be replaced with a halogen atom, and the C1-C12 alkanediyl group has —CH$_2$— that can be replaced with —O— or —C(=O)—.

Specific examples of polymerizable liquid crystal compounds including the compound (A) and the compound (X), each of which is mentioned earlier, include: a polymerizable group-containing compound of compounds listed in "3.8.6 Nettowa-ku [Network] (Kannzenn kakyou-gata [Perfectly crosslinked type])" and "6.5.1 Ekisyou zairyou [Liquid crystal material] b. Jyuugousei nematikku ekisyou zairyou [Polymerizable nematic liquid crystal material]" of Ekisyou binnrann [Handbook of liquid crystals] (edited by Ekisyou binnrann hennsyuu iinnkai [Editorial committee of handbook of liquid crystals], published by MARUZEN Co., Ltd. on Oct. 30, 2000); polymerizable liquid crystal compounds disclosed in Japanese Patent Application Publication, Tokukai, No. 2010-31223, Japanese Patent Application Publication, Tokukai, No. 2010-270108, Japanese Patent Application Publication, Tokukai, No. 2011-6360, and Japanese Patent Application Publication, Tokukai, No. 2011-207765; and the like.

An amount in which a total of the polymerizable liquid crystal compounds is contained in 100 parts by mass of a solid content of the liquid crystal cured film of the present invention is normally 70 parts by mass to 99.5 parts by mass, preferably 80 parts by mass to 99 parts by mass, and more preferably 80 parts by mass to 94 parts by mass. The total which is contained in an amount falling within the above range tends to allow a liquid crystal cured film to be obtained to have an excellent alignment property. Note here that the solid content refers to a total amount of components in which a solvent has been excluded.

[Composition for Liquid Crystal Cured Film Formation]

In addition to the polymerizable liquid crystal compound, a composition for liquid crystal cured film formation can optionally contain a solvent, and other components such as a polymerization initiator, a sensitizer, a polymerization inhibitor, and a leveling agent. Of these components, the composition preferably contains a polymerization initiator from the viewpoint that the polymerization initiator makes it possible to suitably initiate a polymerization reaction and form a liquid crystal cured film. Further, the composition preferably contains a solvent from the viewpoint that the solvent allows a liquid crystal cured film to be obtained to have a uniform thickness. In a case where polymerizable liquid crystal molecules contained in the composition for liquid crystal cured film formation are polymerized, the composition for liquid crystal cured film formation is cured, so that a liquid crystal cured film is formed.

According to the composition for liquid crystal cured film formation, an amount in which the polymerizable liquid crystal compound is contained in 100 parts by mass of a solid content of the composition for liquid crystal cured film formation is normally 70 parts by mass to 99.5 parts by mass, preferably 80 parts by mass to 99 parts by mass, and more preferably 80 parts by mass to 94 parts by mass. The polymerizable liquid crystal compound which is contained in an amount falling within the above range tends to allow a liquid crystal cured film to be obtained to have an excellent alignment property. Note here that the solid content refers to a total amount of components in which the solvent has been excluded from the composition for liquid crystal cured film formation.

[Solvent]

The solvent is preferably a solvent that allows the polymerizable liquid crystal compound to be perfectly dissolved. Further, the solvent is preferably a solvent that is inactive in a polymerization reaction of the polymerizable liquid crystal compound.

Examples of the solvent include: alcohol solvents such as methanol, ethanol, ethylene glycol, isopropyl alcohol, propylene glycol, ethylene glycol methyl ether, ethylene glycol butyl ether, and propylene glycol monomethyl ether; ester solvents such as ethyl acetate, butyl acetate, ethylene glycol methyl ether acetate, γ-butyrolactone, propylene glycol methyl ether acetate, and ethyl lactate; ketone solvents such as acetone, methyl ethyl ketone, cyclopentanone, cyclohexanone, 2-heptanone, and methyl isobutyl ketone; aliphatic hydrocarbon solvents such as pentane, hexane, and heptane; aromatic hydrocarbon solvents such as toluene and xylene; nitrile solvents such as acetonitrile; ether solvents such as tetrahydrofuran and dimethoxyethane; chlorine-containing solvents such as chloroform and chlorobenzene; and the like. These solvents can be used in only one kind or in combination of two or more kinds.

An amount in which the solvent is contained in 100 parts by mass of the composition for liquid crystal cured film formation is preferably 50 parts by mass to 98 parts by mass. Thus, a solid content of 100 parts by mass of the composition for liquid crystal cured film formation is preferably 2 parts by mass to 50 parts by mass. The solid content of the composition for liquid crystal cured film formation which solid content is not more than 50 parts by mass causes the composition for liquid crystal cured film formation to be less viscous, so that a liquid crystal cured film tends to be substantially uniform in thickness and less likely to be uneven. The solid content can be appropriately determined in view of a thickness of a liquid crystal cured film to be produced.

[Polymerization Initiator]

The polymerization initiator is preferably a photopolymerization initiator, and more preferably a photopolymerization initiator that generates a radical by photoirradiation.

Examples of the polymerization initiator include a benzoin compound, a benzophenone compound, a benzil ketal compound, an α-hydroxyketone compound, an α-amino ketone compound, a triazine compound, an iodonium salt, and a sulfonium salt. Specific examples of the polymerization initiator include: Irgacure (Registered Trademark) 907, Irgacure 184, Irgacure 651, Irgacure 819, Irgacure 250, Irgacure 369, Irgacure 379, Irgacure 127, Irgacure 2959, Irgacure 754, and Irgacure 379EG (each manufactured by BASF Japan Ltd.); SEIKUOL BZ, SEIKUOL Z, and SEIKUOL BEE (each manufactured by Seiko Chemical Co., Ltd.); Kayacure BP100 (manufactured by Nippon Kayaku Co., Ltd.); Kayacure UVI-6992 (manufactured by The Dow Chemical Company); ADEKA OPTOMER SP-152, ADEKA OPTOMER SP-170, ADEKA OPTOMER N-1717, ADEKA OPTOMER N-1919, ADEKA ARKLS NCI-831, and ADEKA ARKLS NCI-930 (each manufactured by ADEKA CORPORATION); TAZ-A and TAZ-PP (each manufactured by NIHON SIBER HEGNER K.K.); and TAZ-104 (manufactured by SANWA CHEMICAL CO., LTD.).

The photopolymerization initiator particularly preferably has an oxime structure in a molecule thereof.

According to the present invention, a photopolymerization initiator composition is used. The photopolymerization initiator composition can contain only one kind of photopolymerization initiator or two or more kinds of photopolymerization initiators. The photopolymerization initiator composition preferably has two maximum absorptions at wavelength, i.e., a maximum absorption at wavelength $\lambda(A)$ and a maximum absorption at wavelength $\lambda(B)$. The maximum absorption at wavelength $\lambda(A)$ and the maximum absorption at wavelength $\lambda(B)$ satisfy the relation represented by $\lambda(A)<\lambda(B)$. In addition, the maximum absorption at wavelength $\lambda(A)$ and the maximum absorption at wavelength $\lambda(B)$ of the photopolymerization initiator and the maximum absorption at wavelength $\lambda_{max}(LC)$ of the polymerizable liquid crystal compound more preferably satisfy the following formula:

20 nm<$\lambda(B)-\lambda_{max}(LC)$ or 20 nm<$\lambda_{max}(LC)-\lambda(A)$

In a case where the photopolymerization initiator has two maximum absorptions at wavelength which satisfy the above formula, when the photopolymerization initiator composition and the polymerizable liquid crystal compound are each irradiated with light, the photopolymerization initiator contained in the photopolymerization initiator composition absorbs light without being blocked by light absorption by the polymerizable liquid crystal compound, so that a radical is generated in an amount large enough for a polymerization reaction to be initiated. This makes it possible to suitably carry out the polymerization reaction.

Note here that in a case where two or more kinds of polymerizable liquid crystal compounds are contained in the composition for liquid crystal cured film formation, $\lambda_{max}(LC)$ of a polymerizable liquid crystal compound that is most contained in a mass unit preferably satisfies the above formula. More preferably, $\lambda_{max}(LC)$ of each of all the polymerizable liquid crystal compounds contained satisfies the above formula.

Note that it is possible to use, as the photopolymerization initiator, another photopolymerization initiator in addition to the photopolymerization initiator composition. The another photopolymerization initiator refers to a photopolymerization initiator such that a maximum absorption at wavelength thereof and the maximum absorption at wavelength $\lambda_{max}(LC)$ of the polymerizable liquid crystal compound do not satisfy the above formula.

In order to efficiently use an ultraviolet ray having a wavelength of less than 350 nm and an ultraviolet ray having a wavelength of not less than 350 nm, it is preferable to use, as the photopolymerization initiator contained in the photopolymerization initiator composition, two or more kinds of photopolymerization initiators that differ in main photosensitive wavelength. As a photopolymerization initiator that can efficiently absorb an ultraviolet ray having a wavelength of less than 350 nm, an α-acetophenone compound is preferably used. Examples of the α-acetophenone compound include 2-methyl-2-morpholino-1-(4-methylsulfanylphenyl)propane-1-one, 2-dimethylamino-1-(4-morpholinophenyl)-2-benzil butane-1-one, 2-dimethylamino-1-(4-morpholinophenyl)-2-(4-methylphenylmethyl)butane-1-one, and the like. More preferable examples of the α-acetophenone compound include 2-methyl-2-morpholino-1-(4-methylsulfanylphenyl)propane-1-one and 2-dimethylamino-1-(4-morpholinophenyl)-2-benzil butane-1-one. Examples of commercially-available products of the α-acetophenone compound include Irgacure 369, Irgacure 379EG, and Irgacure 907 (each manufactured by BASF Japan Ltd.), SEIKUOL BEE (manufactured by Seiko Chemical Co., Ltd.), and the like.

From the viewpoint that a polymerization reaction that occurs in a deep part of a liquid crystal cured film is more efficiently progressed, a photopolymerization initiator that can efficiently use an ultraviolet ray having a wavelength of not less than 350 nm is preferably used. For example, it is possible to use a photopolymerization initiator whose absorbance of light having a wavelength of 350 nm is not less than 0.10, more preferably not less than 0.10 and not more than 0.20, in a 0.001 mass % chloroform solution. As the photopolymerization initiator that can efficiently absorb an ultraviolet ray having a wavelength of not less than 350 nm, a triazine compound or an oxime ester carbazole compound is preferable, and an oxime ester carbazole compound is more preferable from the viewpoint of sensitivity. Example of the oxime ester carbazole compound include 1,2-octanedione, 1-[4-(phenylthio)-2-(O-benzoyloxime)], ethanone, 1-[9-ethyl-6-(2-methylbenzoyl)-9H-carbazole-3-yl]-1-(O-acetyloxime), and the like. Examples of commercially-available products of the oxime ester carbazole compound include Irgacure OXE-01, Irgacure OXE-02, and Irgacure OXE-03 (each manufactured by BASF Japan Ltd.), ADEKA OPTOMER N-1919 and ADEKA ARKLS NCI-831 (each manufactured by ADEKA CORPORATION), and the like.

In a case where two or more kinds of different photopolymerization initiators are used, at least one kind of the two or more kinds of different photopolymerization initiators more preferably has an oxime structure in a molecule thereof.

From the viewpoint that a polymerization reaction is more efficiently progressed, the photopolymerization initiator composition or the photopolymerization initiator preferably has two or more maximum absorptions at a wavelength in a range of not less than 300 nm. Examples of the photopolymerization initiator which has two or more maximum absorptions at a wavelength in a range of not less than 300 nm include ADEKA ARKLS NCI-831 (manufactured by ADEKA CORPORATION), Irgacure OXE-03 (manufactured by BASF Japan Ltd.), and the like.

In a case where two or more kinds of photopolymerization initiators that differ from each other are used as the photopolymerization initiator, at least one kind of the two or more kinds of photopolymerization initiators more preferably has an oxime structure in a molecule thereof.

The photopolymerization initiator composition which satisfies the above formula is added in an amount normally of 1 part by mass to 20 parts by mass, and preferably of 3 parts by mass to 18 parts by mass, relative to 100 parts by mass of the polymerizable liquid crystal compound. The photopolymerization initiator composition which is added in an amount falling within the above range is less likely to disturb alignment of the polymerizable liquid crystal compound, and thus such a photopolymerization initiator composition is preferable. The photopolymerization initiator which is contained in the photopolymerization initiator composition and which has at least one maximum absorption at wavelength $\lambda_1$ satisfying the following Formula (II) is added in an amount preferably of 1 part by mass to 20 parts by mass, and more preferably of 3 parts by mass to 18 parts by mass, relative to 100 parts by mass of the polymerizable liquid crystal compound.

20 nm<$|\lambda_1-\lambda_{max}(LC)|$ (II)

The photopolymerization initiator composition which contains two or more kinds of photopolymerization initiators contains, in an amount preferably of not less than 5 mass %, and more preferably of not less than 10 mass %, relative to 100 mass % of the photopolymerization initiator composition, photopolymerization initiators each of which is mainly sensitive to light having a wavelength that is closer to a wavelength of an ultraviolet ray with which the photopolymerization initiator composition is to be irradiated. This allows efficient polymerization of the polymerizable liquid crystal compound.

[Sensitizer]

The composition for liquid crystal cured film formation which composition contains a sensitizer makes it possible to further promote a polymerization reaction of the polymerizable liquid crystal compound contained in the composition.

The sensitizer is preferably a photosensitizer. Examples of the sensitizer include: xanthone compounds such as xanthone and thioxanthone (e.g., 2,4-diethyl thioxanthone, 2-isopropyl thioxanthone, etc.); anthracene compounds such as anthracene and alkoxy group-containing anthracene (e.g., dibutoxyanthracene); phenothiazine; rubrene; and the like.

The sensitizer is contained in an amount preferably of 0.1 parts by mass to 30 parts by mass, more preferably of 0.5 parts by mass to 10 parts by mass, and still more preferably of 0.5 parts by mass to 8 parts by mass, relative to 100 parts by mass of the polymerizable liquid crystal compound.

[Polymerization Inhibitor]

Use of the polymerization inhibitor makes it possible to control a degree of progress of the polymerization reaction of the polymerizable liquid crystal compound.

The polymerization inhibitor is exemplified by radical capture agents such as (i) phenolic compounds such as 2,6-di-tert-butyl-4-methylphenol, (ii) sulfuric compounds such as dilauryl thiodipropionate, (iii) phosphorous compounds such as trioctyl phosphite, (iv) hindered amine structure-containing amine compounds typified by 2,2,6,6-tetramethylpiperidine, and (v) the like.

From the viewpoint that a liquid crystal cured film is less colored, a phenolic compound is preferable as the polymerization inhibitor.

The polymerization inhibitor is contained in an amount preferably of 0.1 parts by mass to 30 parts by mass, more preferably of 0.5 parts by mass to 10 parts by mass, and still more preferably of 0.5 parts by mass to 8 parts by mass, relative to 100 parts by mass of the polymerizable liquid crystal compound. The polymerization inhibitor which is contained in an amount falling within the above range makes it possible to polymerize the polymerizable liquid crystal compound without disturbing alignment of the polymerizable liquid crystal compound, and thus such a polymerization inhibitor is preferable. Polymerization inhibitors can be used in only one kind or in combination of two or more kinds.

[Leveling Agent]

The leveling agent, which is an additive that has a function of adjusting fluidity of a composition so as to further level a film to be obtained by application of the composition, is exemplified by a surfactant. Preferable examples of the leveling agent include: a leveling agent whose main component is a polyacrylate compound, such as "BYK-361N" (manufactured by BYK Chemie); and a leveling agent whose main component is a fluorine atom-containing compound, such as Surflon (Registered Trademark) "S-381" (manufactured by AGC SEIMI CHEMICAL CO., LTD.).

The leveling agent is contained in an amount preferably of 0.01 parts by mass to 5 parts by mass, and more preferably of 0.1 parts by mass to 3 parts by mass, relative to 100 parts by mass of the polymerizable liquid crystal compound. The leveling agent which is contained in an amount falling within the above range (i) makes it easy to parallelly align the polymerizable liquid crystal compound and (ii) tends to make a liquid crystal cured film to be obtained flatter and smoother. Thus, such a leveling agent is preferable. The composition for liquid crystal cured film formation can contain two or more kinds of leveling agents.

[Physical Properties of Liquid Crystal Cured Film]

Usually, the liquid crystal cured film of the present invention is a film obtained by curing the composition in a state where the polymerizable liquid crystal compound is aligned, and has a thickness of not more than 5 μm. The liquid crystal cured film is preferably a film obtained by curing the composition in a state where the polymerizable liquid crystal compound is aligned in a direction parallel to or perpendicular to a surface of the base material.

The thickness of the liquid crystal cured film is preferably 0.5 μm to 5 μm, more preferably 1 (one) μm to 3 μm. The thickness of the liquid crystal cured film can be measured with use of an interference thickness meter, a laser microscope, or a stylus type thickness meter.

The liquid crystal cured film, obtained by curing the composition in the state where the polymerizable liquid crystal compound is aligned in the direction parallel to the surface of the base material, preferably has the following birefringence Δn(λ) with respect to light having a wavelength of μ nm. That is, the birefringence Δn(μ) preferably satisfies an optical characteristic represented by the following Formulae (1) and (2), more preferably satisfies an optical characteristic represented by the following Formulae (1), (2), and (3):

$$Re(450)/Re(550) \leq 1.00 \tag{1}$$

$$1.00 \leq Re(650)/Re(550) \tag{2}$$

wherein: $Re(450)$ represents an in-plane phase difference value with respect to light having a wavelength of 450 nm; $Re(550)$ represents an in-plane phase difference value with respect to light having a wavelength of 550 nm; and $Re(650)$ represents an in-plane phase difference value with respect to light having a wavelength of 650 nm.

$$100 \text{ nm} < Re(550) < 160 \text{ nm} \tag{3}$$

wherein $Re(550)$ represents an in-plane phase difference value with respect to light having a wavelength of 550 nm.

The liquid crystal cured film of the present invention, which liquid crystal cured film has a maximum absorption at a wavelength in a range of not less than 300 nm and not more than 380 nm, makes it possible to protect an element of a liquid crystal display device or an EL display device from a ultraviolet ray that may cause a deterioration of the element. The liquid crystal cured film of the present invention preferably has a maximum absorption at a wavelength in a range of not less than 330 nm and not more than 380 nm. That is, the liquid crystal cured film of the present invention is preferably made from the polymerizable liquid crystal compound having a maximum absorption at a wavelength in a range of not less than 300 nm and not more than 380 nm, more preferably made from the polymerizable liquid crystal compound having a maximum absorption at a wavelength in a range of not less than 330 nm and not more than 380 nm.

The liquid crystal cured film, obtained by curing the composition in the state where the polymerizable liquid crystal compound is aligned in the direction perpendicular to the surface of the base material, preferably satisfies the following Formula (4):

$$nz > nx \approx ny \tag{4}$$

wherein: nz represents a refractive index measured in a thickness direction of the liquid crystal cured film; nx represents the highest refractive index of refractive indices measured in an in-plane direction of the liquid crystal cured film; and ny represents an in-plane refractive index measured in a direction of the liquid crystal cured film which direction is perpendicular to the in-plane direction, in which nx is measured.

The in-plane phase difference value of the liquid crystal cured film can be controlled by adjusting the thickness of the liquid crystal cured film. The in-plane phase difference value is determined by the following Formula (5). Therefore, it is only necessary to adjust $\Delta n(\lambda)$ and the thickness "d" in order to obtain a desired in-plane phase difference value ($Re(\lambda)$).

$$Re(\lambda)=d\times\Delta n(\lambda) \qquad (5)$$

wherein: $Re(\lambda)$ represents an in-plane phase difference value at a wavelength of $\lambda$ nm; "d" represents a thickness; and $\Delta n(\lambda)$ represents a birefringence at the wavelength of $\lambda$ nm).

The birefringence $\Delta n(\lambda)$ is obtained by (i) measuring the in-plane phase difference value and (ii) dividing the in-plane phase difference value by the thickness of the liquid crystal cured film. Note, here, that it is possible to measure a substantial characteristic of the liquid crystal cured film by measuring the liquid crystal cured film formed on the base material, such as a glass substrate, which does not have an in-plane phase difference by itself. A specific measurement method will be later described in Examples.

In a case of the liquid crystal cured film obtained by curing the composition in the state where the polymerizable liquid crystal compound is aligned in the direction perpendicular to the surface of the base material, Re(550) is preferably 0 (zero) nm to 10 nm, more preferably 0 (zero) nm to 5 nm. A phase difference value Rth in the thickness direction is preferably −10 nm to −300 nm, more preferably −20 nm to −200 nm. The liquid crystal cured film which satisfies Formula (4) and which has Re(550) and Rth in the respective foregoing ranges is particularly suitable for compensation for an in-plane switching (IPS) mode liquid crystal display device.

Rth can be calculated from (i) a phase difference value $R_{40}$ which is measured by inclining a plane of the liquid crystal cured film by 40 degrees to an in-plane fast axis which is assumed to be an inclined axis and (ii) an in-plane phase difference value $R_0$. That is, Rth can be calculated by (a) calculating nx, fly, and nz by the following Formulae (9) through (11) from (i) the in-plane phase difference value $R_0$, (ii) the phase difference value $R_{40}$ which is measured by inclining the plane of the liquid crystal cured film by 40 degrees to the in-plane fast axis which is assumed to be an inclined axis, (iii) the thickness "d" of the liquid crystal cured film, and (iv) an average refractive index no of the liquid crystal cured film and (b) substituting nx, ny, and nz thus obtained into Formula (8).

$$Rth=[(nx+ny)/2-nz]\times d \qquad (8)$$

$$R_0=(nx-ny)\times d \qquad (9)$$

$$R_{40}=(nx-ny')\times d/\cos(\varphi) \qquad (10)$$

$$(nx+ny+nz)/3=n_0 \qquad (11)$$

wherein:

$$\Phi=\sin^{-1}[\sin(40°)/n_0]$$

$$ny'=ny\times nz/[ny^2\times\sin^2(\varphi)+nz^2\times\cos^2(\varphi)]^{1/2}$$

[Base Material]

The base material, which is exemplified by a glass base material and a plastic base material, is preferably a plastic base material. Examples of plastic of which the plastic base material is made include plastics such as polyolefins such as polyethylene, polypropylene, and a norbornene polymer; cyclic olefinic resins; polyvinyl alcohol; polyethylene terephthalate; polymethacrylic acid ester; polyacrylic ester; cellulose esters such as triacetyl cellulose, diacetyl cellulose, and cellulose acetate propionate; polyethylene naphthalate; polycarbonate; polysulfone; polyether sulfone; polyether ketone; polyphenylene sulfide and polyphenylene oxide; and the like. Examples of a commercially-available cellulose ester base material include: "Fuji TAC film" (manufactured by FujiFilm Corporation); "KC8UX2M", "KC8UY", and "KC4UY" (each manufactured by KONICA MINOLTA JAPAN, INC.); and the like.

Examples of commercially-available cyclic olefinic resins include "Topas" (Registered Trademark) (manufactured by Ticona (Germany)), "ARTON" (Registered Trademark) (manufactured by JSR Corporation), "ZEONOR" (Registered Trademark) and "ZEONEX" (Registered Trademark) (each manufactured by Zeon Corporation), and "APEL" (Registered Trademark) (manufactured by Mitsui Chemicals, Inc.). Such a cyclic olefinic resin can be made into the base material by film formation by publicly-known means such as a solvent cast method or a melt extrusion method. It is also possible to use a commercially-available cyclic olefinic resin base material. The commercially-available cyclic olefinic resin base material is exemplified by "Esushina" (Registered Trademark) and "SCA40" (Registered Trademark) (each manufactured by SEKISUI CHEMICAL CO., LTD.), "ZEONOR FILM" (Registered Trademark) (manufactured by Optes Co., Ltd.), and "ARTON FILM" (Registered Trademark) (manufactured by JSR Corporation).

The base material preferably has a small thickness in that the base material which is thin has a small mass (is light) and thus can be practically treated (is easy to industrially treat). Note, however, that the base material which has a too small thickness tends to be lower in strength and inferior in processability. The base material has a thickness normally of 5 μm to 300 μm and preferably of 20 μm to 200 μm.

[Alignment Film]

The alignment film is a film that has an alignment regulating force by which the polymerizable liquid crystal compound is subjected to liquid crystal alignment in a desired direction. The alignment film is exemplified by an alignment film made of an alignment polymer, a photoalignment film, and a groove alignment film.

The alignment film facilitates liquid crystal alignment of the polymerizable liquid crystal compound. States of liquid crystal alignment such as parallel alignment, perpendicular alignment, hybrid alignment, and tilt alignment change in accordance with a property of the alignment film and a property of the polymerizable liquid crystal compound, and it is optionally selectable how to combine the above states. In a case where the alignment film is a material that serves as the alignment regulating force by which to cause parallel alignment, the polymerizable liquid crystal compound can be subjected to parallel alignment or hybrid alignment. In a case where the alignment film is a material that serves as the alignment regulating force by which to cause perpendicular alignment, the polymerizable liquid crystal compound can be subjected to perpendicular alignment or tilt alignment.

Assuming that a plane of a liquid crystal cured film is a reference, the expressions such as "parallel" and "perpendicular" each refer to a direction in which a long axis of the polymerizable liquid crystal compound aligned extends. Parallel alignment refers to alignment such that the polymerizable liquid crystal compound aligned has a long axis that extends in a direction parallel to the plane of the liquid crystal cured film. The term "parallel" herein means an angle of 0°±20° with respect to the plane of the liquid crystal cured film. Perpendicular alignment refers to alignment such that the polymerizable liquid crystal compound aligned has a long axis that extends in a direction perpendicular to the plane of the liquid crystal cured film. The term "perpendicular" herein means an angle of 90°±20° with respect to the plane of the liquid crystal cured film.

In a case where the alignment film is made of an alignment polymer, the alignment regulating force can be optionally adjusted in accordance with a state of a surface of the alignment polymer and/or a rubbing condition. In a case where the alignment film is made of a photoalignment polymer, the alignment regulating force can be optionally adjusted in accordance with, for example, a condition under which to irradiate the photoalignment polymer with polarized light. Liquid crystal alignment of the polymerizable liquid crystal compound can also be controlled by selecting physical properties of the polymerizable liquid crystal compound, such as surface tension and liquid crystallinity.

In a case where a liquid crystal cured film satisfies Formula (4), liquid crystal alignment of the polymerizable liquid crystal compound of which the liquid crystal cured film is made is preferably perpendicular alignment. In order to perpendicularly align the polymerizable liquid crystal compound, it is preferable to use an alignment film that has a nonpolar substituent containing, for example, a silicon atom and a fluorine atom. As such an alignment film, it is possible to use a material that is generally used as a liquid crystal alignment film of a perpendicular alignment liquid crystal display element and is exemplified by materials disclosed in Japanese Patent No. 4605016, Japanese Patent No. 4985906, Japanese Patent No. 4502119, and International Publication No. WO2008/117760.

An alignment film that is provided between a base material and a liquid crystal cured film is preferably a film that is insoluble in a solvent to be used to provide a liquid crystal cured film on the alignment film and is resistant to heat during a heat treatment for removal of the solvent and liquid crystal alignment. The alignment film is exemplified by an alignment film made of an alignment polymer, a photoalignment film, a groove alignment film, and the like.

The alignment film has a thickness normally of 10 nm to 500 nm and preferably of 10 nm to 200 nm.

[Alignment Film Made of Alignment Polymer]

An alignment film made of an alignment polymer is normally obtained by applying, to a base material, a composition in which an alignment polymer is dissolved in a solvent (hereinafter also referred to as an alignment polymer composition), and removing the solvent, or by applying the alignment polymer composition to the base material, removing the solvent, and carrying out rubbing (a rubbing method).

The alignment polymer contained in the alignment polymer composition only needs to have a concentration falling within a range that allows material(s) of the alignment polymer to be completely dissolved in the solvent. The concentration is preferably 0.1 mass % to 20 mass %, and more preferably 0.1 mass % to 10 mass % in solid content terms, relative to the solution.

A commercially-available alignment polymer composition is exemplified by, for example, SUNEVER (Registered Trademark) (manufactured by NISSAN CHEMICAL INDUSTRIES, LTD.) and OPTMER (Registered Trademark) (manufactured by JSR Corporation).

[Photoalignment Film]

A photoalignment film is normally obtained by applying, to a base material, a composition containing a photoreactive group-containing polymer or a photoreactive group-containing monomer and a solvent (hereinafter also referred to as a composition for photoalignment film formation), and irradiating, with polarized light (preferably polarized UV), the base material to which the composition has been applied. The photoalignment film is more preferable in that a direction of the alignment regulating force can be optionally controlled by selecting a direction of polarized light with which to irradiate the base material to which the composition has been applied.

A photoreactive group refers to a group that generates liquid crystal alignment power by light irradiation. Specifically, a photoreactive group is a group that causes a photoreaction in which liquid crystal alignment power originates, such as molecular alignment induction or a molecular isomerization reaction caused by light irradiation, a dimerization reaction caused by light irradiation, a photocrosslinking reaction caused by light irradiation, or a photolysis reaction caused by light irradiation. In particular, a photoreactive group that causes a dimerization reaction or a photocrosslinking reaction is preferable in terms of excellence in alignment property. As a photoreactive group that can cause the above reaction, a group that has an unsaturated bond, particularly a double bond is preferable, and a group that has at least one bond selected from the group consisting of a carbon-carbon double bond (C=C bond), a carbon-nitrogen double bond (C=N bond), a nitrogen-nitrogen double bond (N=N bond), and a carbon-oxygen double bond (C=O bond) is particularly preferable.

The photoreactive group-containing polymer or the photoreactive group-containing monomer is contained in an amount preferably of not less than 0.2 mass %, and particularly preferably of 0.3 mass % to 10 mass %, relative to the composition for photoalignment film formation. The composition for photoalignment film formation can contain polymeric materials such as polyvinyl alcohol and polyimide, and/or a photosensitizer, provided that a characteristic of the photoalignment film is not seriously impaired.

Polarized light irradiation can be carried out in a mode in which a composition obtained by removing the solvent from the composition for photoalignment film formation, the composition having been applied to the base material, is directly irradiated with polarized light, or in a mode in which the composition is irradiated with polarized light that is incident on the base material and then is transmitted through the base material. The polarized light is particularly preferably substantially parallel light. Polarized light with which to irradiate the composition desirably has a wavelength in a wavelength region in which a photoreactive group of the photoreactive group-containing polymer or the photoreactive group-containing monomer can absorb light energy. Specifically, the polarized light with which to irradiate the composition is particularly preferably UV (ultraviolet ray) having a wavelength of 250 nm to 400 nm.

Note that, in a case where masking is carried out during rubbing or polarized light irradiation, it is possible to form a plurality of regions (patterns) that differ in direction of liquid crystal alignment.

[Groove Alignment Film]

A groove alignment film is a film whose surface is provided with an uneven pattern or a plurality of grooves. In a case where the polymerizable liquid crystal compound is applied to a film having a plurality of linear grooves that are provided at regular intervals, liquid crystal molecules are aligned in a direction along those grooves.

A method for obtaining the groove alignment film is exemplified by, for example, (i) a method in which a surface of a photosensitive polyimide film is exposed to light via an exposure mask having a pattern-shaped slit, and then an uneven pattern is formed by carrying out development and a rinse treatment, (ii) a method in which a plate-like matrix whose surface is provided with a groove is provided with a resin layer of a UV cured resin which has not been cured, and then the resin layer is cured after being moved to a base material, and (iii) a method in which irregularities are formed by pressing a roll matrix having a plurality of grooves against a film, provided on the base material, of the UV cured resin which has not been cured, and then the film is cured. The method for obtaining the groove alignment film is specifically exemplified by, for example, methods disclosed in Japanese Patent Application Publication, Tokukaihei, No. 6-34976 (1994) and Japanese Patent Application Publication, Tokukai, No. 2011-242743.

Embodiment 2: Optical Film

The present invention can be an optical film including a liquid crystal cured film in accordance with Embodiment 1 of the present invention.

Embodiment 3: Circularly Polarizing Plate

The present invention can be a circularly polarizing plate including the liquid crystal cured film in accordance with Embodiment 1 of the present invention or the optical film in accordance with Embodiment 2 of the present invention, and a polarizing plate.

A method for producing the circularly polarizing plate can include the following methods (i) and (ii):

(i) A liquid crystal cured film is provided on a base material or on an alignment film provided on the base material, the liquid crystal cured film is bonded to a transfer receiving body (here, a polarizer or a polarizing plate) via a first adhesive agent layer, and the base material, or the base material and the alignment film is/are removed, so that a laminated body including the liquid crystal cured film, the adhesive agent layer, and the transfer receiving body is formed; and (ii) In a case where only the base material is removed in the above (i), a second adhesive agent layer is provided on the alignment film of the laminated body obtained, so that a circularly polarizing plate including the polarizer or the polarizing plate, the first adhesive agent layer, the liquid crystal cured film, the alignment film, and the second adhesive agent layer which are laminated in this order can be produced. In a case where the base material and the alignment film are removed in the above (i), a second adhesive agent layer is provided on the liquid crystal cured film of the laminated body obtained, so that a circularly polarizing plate including the polarizer or the polarizing plate, the first adhesive agent layer, the liquid crystal cured film, and the second adhesive agent layer which are laminated in this order can be produced.

The liquid crystal cured film can be a film that is cured in a state in which the polymerizable liquid crystal compound is aligned in a direction perpendicular or parallel to a surface of the base material.

[A Method for Producing Laminated Body]

The laminated body can be produced by the above method (i) of the method for producing the circularly polarizing plate. Note that the adhesive agent layer can be provided on the liquid crystal cured film or on the transfer receiving body. In a case where the alignment film is provided between the base material and the liquid crystal cured film, it is possible to remove the alignment film together with the base material.

In a case of a base material whose surface has a functional group that is to form a chemical bond with a liquid crystal cured film, an alignment film, or the like, the functional group forms a chemical bond with the liquid crystal cured film, the alignment film, or the like, and therefore the base material tends to become difficult to remove. From this, in a case where a base material is to be peeled and removed, it is preferable to employ a base material whose surface has a small number of functional groups or it is preferable to employ a base material which has not been subjected to surface treatment for forming a functional group on a surface of the base material.

An alignment film which has a functional group by which a chemical bond is formed with a base material tends to cause greater adhesion between the base material and the alignment film. Therefore, in a case where a base material is to be peeled and removed, it is preferable to employ an alignment film which has a small number of functional groups by which a chemical bond is formed with the base material. A solution of the alignment polymer composition, the composition for photoalignment film formation, and the like preferably contains no reagent for cross-linking the base material with the alignment film, and preferably contains no component such as a solvent which dissolves the base material.

An alignment film which has a functional group by which a chemical bond is formed with a liquid crystal cured film tends to cause greater adhesion between the liquid crystal cured film and the alignment film. Therefore, in a case where an alignment film is to be removed together with a base material, it is preferable to employ an alignment film which has a small number of functional groups by which a chemical bond is formed with the liquid crystal cured film. A solution of the alignment polymer composition, the composition for photoalignment film formation, and the like preferably contains no reagent for cross-linking the liquid crystal cured film with the alignment film.

A liquid crystal cured film which has a functional group by which a chemical bond is formed with an alignment film tends to cause greater adhesion between the alignment film and the liquid crystal cured film. Therefore, in a case where a base material is to be removed, or in a case where an alignment film is to be removed together with a base material, it is preferable to employ a liquid crystal cured film which has a small number of functional groups by which a chemical bond is formed with the base material or the alignment film. The composition for liquid crystal cured film formation preferably contains no reagent for cross-linking the liquid crystal cured film with the base material or the alignment film.

[First Adhesive Agent Layer]

A first adhesive agent layer is formed from an adhesive agent. Examples of the adhesive agent include a pressure-sensitive adhesive, a dry hardening adhesive agent, and a chemical reaction adhesive agent. The chemical reaction adhesive agent can be, for example, an energy ray curing adhesive agent. The adhesive agent layer is preferably made of a pressure-sensitive adhesive or an active energy ray curing adhesive agent.

[Pressure-Sensitive Adhesive]

A pressure-sensitive adhesive normally contains a polymer and can contain a solvent.

Examples of the polymer include an acrylic polymer, a silicone polymer, polyester, polyurethane, polyether, and the like. It is preferable to employ an acrylic pressure-sensitive adhesive which contains an acrylic polymer among these because such an acrylic pressure-sensitive adhesive is excellent in optical transparency, has moderate wettability and cohesive force, is excellent in adhesiveness, has high weatherability, heat resistance, and the like, and hardly causes floating, peeling, or the like under conditions of heating and/or humidification.

The acrylic polymer is preferably a copolymer of (i) (meth)acrylate in which an alkyl group of an ester moiety is a C1-C20 alkyl group such as a methyl group, an ethyl group, or a butyl group (hereinafter, acrylate and methacrylate are sometimes collectively referred to as "(meth)acrylate", and acrylic acid and methacrylic acid are sometimes collectively referred to as "(meth)acrylic acid") and (ii) a (meth)acrylic monomer having a functional group such as (meth)acrylic acid or hydroxyethyl (meth)acrylate.

It is preferable to employ a pressure-sensitive adhesive which contains the copolymer because such a pressure-sensitive adhesive is excellent in adhesion and the adhesive agent layer which has been provided on the display device can be relatively easily removed from the display device without causing residual adhesive and/or the like. A glass transition temperature of the acrylic polymer is preferably 25° C. or lower, and more preferably 0° C. or lower. A mass average molecular weight of the acrylic polymer is preferably not less than 100 thousand.

Examples of the solvent include water; alcohol solvents such as methanol, ethanol, ethylene glycol, isopropyl alcohol, propylene glycol, methyl cellosolve, butyl cellosolve, and propylene glycol monomethyl ether; ester solvents such as ethyl acetate, butyl acetate, ethylene glycol methyl ether acetate, γ-butyrolactone, propylene glycol methyl ether acetate, and ethyl lactate; ketone solvents such as acetone, methyl ethyl ketone, cyclopentanone, cyclohexanone, methyl amyl ketone, and methyl isobutyl ketone; aliphatic hydrocarbon solvents such as pentane, hexane, and heptane; aromatic hydrocarbon solvents such as toluene and xylene; nitrile solvents such as acetonitrile; ether solvents such as tetrahydrofuran and dimethoxyethane; chlorine-substituted hydrocarbon solvents such as chloroform and chlorobenzene; and the like. These solvents can be used in only one kind or in combination of two or more kinds.

The pressure-sensitive adhesive can contain a light diffusing agent. The light diffusing agent only needs to be an additive which (i) gives a light diffusing property to a pressure-sensitive adhesive and (ii) is in a form of fine particles having a refractive index different from that of a polymer contained in the pressure-sensitive adhesive. Examples of the light diffusing agent include fine particles of an inorganic compound and fine particles of an organic compound (polymer). Many polymers (including an acrylic polymer) each of which is contained in the pressure-sensitive adhesive as an active ingredient have a refractive index of approximately 1.4, and therefore it is preferable to appropriately select a light diffusing agent which has a refractive index of 1 to 2. A difference in refractive index between a polymer contained in the pressure-sensitive adhesive as an active ingredient and the light diffusing agent is normally not less than 0.01, and preferably 0.01 to 0.5 from the viewpoint of brightness and display performance of the display device. The fine particles used as the light diffusing agent are preferably fine particles having a spherical shape (furthermore, almost monodispersed fine particles), and more preferably fine particles whose average particle size is 2 μm to 6 μm.

A refractive index is measured with a general minimum deviation method or an Abbe refractometer.

Examples of the fine particles of the inorganic compound include aluminum oxide (having a refractive index of 1.76), silicon oxide (having a refractive index of 1.45), and the like.

Examples of the fine particles of the organic compound (polymer) include melamine beads (having a refractive index of 1.57), polymethyl methacrylate beads (having a refractive index of 1.49), methyl methacrylate/styrene copolymer resin beads (having a refractive index of 1.50 to 1.59), polycarbonate beads (having a refractive index of 1.55), polyethylene beads (having a refractive index of 1.53), polystyrene beads (having a refractive index of 1.6), polyvinyl chloride beads (having a refractive index of 1.46), silicone resin beads (having a refractive index of 1.46), and the like.

The light diffusing agent is contained in an amount normally of 3 parts by mass to 30 parts by mass, relative to 100 parts by mass of a polymer.

A haze value of the adhesive agent layer formed from a pressure-sensitive adhesive in which the light diffusing agent is dispersed is preferably 20% to 80%, from the viewpoint of securing brightness of the display device and hardly causing bleeding and a blur in a displayed image. The haze value is a value expressed by "(diffuse transmittance/total light transmittance)×100 (%)" and is measured in conformity to JIS K 7105.

A thickness of the adhesive agent layer formed from the pressure-sensitive adhesive is determined in accordance with adhesion and the like of the adhesive agent layer, and is not limited to a particular one. Normally, the thickness of the adhesive agent layer is 1 μm to 40 μm. In view of processability, durability, and the like, the thickness is preferably 3 μm to 25 μm, and more preferably 5 μm to 20 μm. In a case where the thickness of the adhesive agent layer formed from the pressure-sensitive adhesive is 5 μm to 20 μm, it is possible to (i) maintain brightness when the display device is viewed from front or viewed obliquely and (ii) hardly cause bleeding and a blur in a displayed image.

[Dry Hardening Adhesive Agent]

The dry hardening adhesive agent can contain a solvent.

Examples of the dry hardening adhesive agent include a polymer of monomers having (i) a protic functional group such as a hydroxyl group, a carboxyl group, or an amino group and (ii) an unsaturated ethylene group; a composition which contains urethane resin as a main component and further contains a crosslinking agent or a curable compound such as polyvalent aldehyde, an epoxy compound, epoxy resin, a melamine compound, a zirconia compound, or a zinc compound; and the like.

Examples of the polymer of monomers having (i) a protic functional group such as a hydroxyl group, a carboxyl group, or an amino group and (ii) an unsaturated ethylene group include an ethylene-maleic acid copolymer, an itaconic acid copolymer, an acrylic acid copolymer, an acrylamide copolymer, saponified polyvinyl acetate, polyvinyl alcohol resin, and the like.

Examples of the polyvinyl alcohol resin include polyvinyl alcohol, partially saponified polyvinyl alcohol, completely saponified polyvinyl alcohol, carboxyl group modified polyvinyl alcohol, acetoacetyl group modified polyvinyl alcohol, methylol group modified polyvinyl alcohol, amino group modified polyvinyl alcohol, and the like. An amount of polyvinyl alcohol resin contained in a water-based adhesive agent is normally 1 part by mass to 10 parts by mass, and preferably 1 part by mass to 5 parts by mass, relative to 100 parts by mass of water.

The urethane resin can be polyester ionomer urethane resin or the like. The polyester ionomer urethane resin is urethane resin which has a polyester skeleton and to which a small amount of an ionic component (hydrophilic component) is introduced. Such ionomer urethane resin becomes an emulsion by being emulsified in water without using an emulsifier, and can therefore be used as a water-based adhesive agent. In a case where the polyester ionomer urethane resin is used, addition of a water-soluble epoxy compound as a crosslinking agent is effective.

Examples of the epoxy resin include polyamide epoxy resin which is obtained by causing epichlorohydrin to react with polyamide polyamine which has been obtained by causing polyalkylene polyamine such as diethylenetriamine or triethylenetetramine to react with dicarboxylic acid such as adipic acid. Examples of commercially-available products of such polyamide epoxy resin include "Sumireds Resin (Registered Trademark) 650" and "Sumireds Resin 675" (each manufactured by Sumika Chemtex Company, Limited), "WS-525" (manufactured by Japan PMC Corporation), and the like. In a case where the epoxy resin is added, an amount of the epoxy resin to be added is normally 1 part by mass to 100 parts by mass, and preferably 1 part by mass to 50 parts by mass, relative to 100 parts by mass of the polyvinyl alcohol resin.

A thickness of an adhesive agent layer formed from the dry hardening adhesive agent is normally 0.001 µm to 5 µm, preferably 0.01 µm to 2 µm, and more preferably not more than 1 µm. In a case where the adhesive agent layer formed from the dry hardening adhesive agent is excessively thick, appearance of the liquid crystal cured film is more likely to become defective.

[Active Energy Ray Curing Adhesive Agent]

The active energy ray curing adhesive agent can contain a solvent. The active energy ray curing adhesive agent indicates an adhesive agent which is hardened in response to active energy ray irradiation.

Examples of the active energy ray curing adhesive agent include a cation polymerizable adhesive agent containing an epoxy compound and a cation polymerization initiator; a radical polymerizable adhesive agent containing an acrylic curing component and a radical polymerization initiator; an adhesive agent which contains (i) a cation polymerizable curing component such as an epoxy compound, (ii) a radical polymerizable curing component such as an acrylic compound, (iii) a cation polymerization initiator, and (iv) a radical polymerization initiator; an adhesive agent which does not contain those polymerization initiators and is hardened in response to electron beam irradiation; and the like. The active energy ray curing adhesive agent is preferably a radical polymerizable active energy ray curing adhesive agent which contains an acrylic curing component and a radical polymerization initiator. Alternatively, it is preferable to employ a cation polymerizable active energy ray curing adhesive agent which contains an epoxy compound and a cation polymerization initiator and can be used with substantially no solvent.

Examples of the epoxy compound include a glycidyl etherified product of an aromatic compound or a chain compound having a hydroxyl group; a glycidyl aminated product of a compound having an amino group; an epoxide of a chain compound having a C—C double bond (C=C); an alicyclic epoxy compound in which (i) a glycidyloxy group or an epoxyethyl group is bonded to a saturated carbocyclic ring directly or via alkylene or (ii) an epoxy group is directly bonded to a saturated carbocyclic ring; and the like. These epoxy compounds can be used in only one kind or in combination of two or more kinds. Among these epoxy compounds, the alicyclic epoxy compound is preferable because of its excellent cation polymerizability.

Examples of commercially-available epoxy compounds include "jER" Series (manufactured by Mitsubishi Chemical Corporation), "EPICLON" (manufactured by DIC Corporation), "Epototo" (Registered Trademark) (manufactured by TOHTO Chemical Industry Co., Ltd.), "ADEKA RESIN" (Registered Trademark) (manufactured by ADEKA CORPORATION), "Denacol" (Registered Trademark) (manufactured by Nagase ChemteX Corporation), "Dow Epoxy" (manufactured by Dow Chemical Company), "TEPIC" (Registered Trademark) (manufactured by Nissan Chemical Industries, Ltd.), and the like. Examples of the alicyclic epoxy compound include "CELLOXIDE" Series and "CYCLOMER" (each manufactured by DAICEL CORPORATION), "CYRACURE UVR" Series (manufactured by Dow Chemical Company), and the like.

The active energy ray curing adhesive agent which contains an epoxy compound can further contain a compound other than the epoxy compound. Examples of the compound other than the epoxy compound include an oxetane compound, an acrylic compound, and the like. Among these, it is preferable to use the oxetane compound in combination with the epoxy compound because the oxetane compound may increase a curing speed in cation polymerization.

Examples of the oxetane compound include "ARONE OXETANE" (Registered Trademark) Series (manufactured by TOAGOSEI CO., LTD.), "ETERNACOLL" (Registered Trademark) Series (manufactured by Ube Industries, Ltd.), and the like.

The active energy ray curing adhesive agent which contains an epoxy compound or an oxetane compound is preferably used as a solventless agent.

The cation polymerization initiator is a compound which generates a cationic species in response to active energy ray irradiation such as ultraviolet ray irradiation. Examples of the cation polymerization initiator include aromatic diazonium salt; onium salts such as aromatic iodonium salt and aromatic sulfonium salt; and an iron-arene complex. These cation polymerization initiators can be used in only one kind or in combination of two or more kinds.

Examples of commercially-available cation polymerization initiators include "KAYARAD" (Registered Trademark) Series (manufactured by Nippon Kayaku Co., Ltd.), "CYRACURE UVI" Series (manufactured by Dow Chemical Company), "CPI" Series (manufactured by San-Apro Ltd.), "TAZ", "BBI", and "DTS" (each manufactured by Midori Kagaku Co., Ltd.), "ADEKA OPTOMER" Series (manufactured by ADEKA CORPORATION), "Rhodorsil" (Registered Trademark) (manufactured by Rhodia Inc.), and the like.

The cation polymerization initiator is contained in an amount normally of 0.5 parts by mass to 20 parts by mass, and preferably of 1 part by mass to 15 parts by mass, relative to 100 parts by mass of the active energy ray curing adhesive agent.

Examples of the acrylic curing component include (meth) acrylate and (meth) acrylic acid such as methyl (meth) acrylate, hydroxyethyl (meth)acrylate, and the like.

Examples of the radical polymerization initiator include a hydrogen abstraction type photo-radical generator, a cleavage type photo-radical generator, and the like.

Examples of the hydrogen abstraction type photo-radical generator include a naphthalene derivative such as 1-methylnaphthalene; an anthracene derivative; a pyrene derivative; a carbazole derivative; a benzophenone derivative; a thioxanthone derivative; a coumarin derivative; and the like.

Examples of the cleavage type photo-radical generator include a benzoin ether derivative; arylalkyl ketones such as an acetophenone derivative; oxime ketones; acylphosphine oxides; thiobenzoic acid S-phenyls; titanocenes; high molecular weight derivatives of those; and the like.

Among the cleavage type photo-radical generators, the acylphosphine oxides are preferable. Specifically, it is preferable to use trimethylbenzoyl diphenylphosphine oxide (product name "DAROCURE TPO"; manufactured by BASF Japan Ltd.), bis(2,6-dimethoxy-benzoyl)-(2,4,4-trimethyl-pentyl)-phosphine oxide (product name "CGI 403"; manufactured by BASF Japan Ltd.), or bis(2,4,6-trimethylbenzoyl)-2,4-dipentoxyphenylphosphine oxide (product name "Irgacure 819"; manufactured by BASF Japan Ltd.).

The active energy ray curing adhesive agent can contain a sensitizer. The sensitizer is contained in an amount preferably of 0.1 parts by mass to 20 parts by mass, relative to 100 parts by mass of the active energy ray curing adhesive agent.

The active energy ray curing adhesive agent can further contain an ion trapping agent, an antioxidant, a chain transfer agent, a tackifier, thermoplastic resin, filler, a fluidity adjusting agent, a plasticizer, an anti-foaming agent, and the like.

In this specification, an active energy ray is defined as an energy ray which can generate an activated species by decomposing a compound which generates an activated species. Examples of such an active energy ray include visible light, an ultraviolet ray, an infrared ray, an X-ray, an α-ray, a β-ray, a γ-ray, an electron ray, and the like. It is preferable to employ an ultraviolet ray or an electron ray.

An acceleration voltage for electron ray irradiation is normally 5 kV to 300 kV, and preferably 10 kV to 250 kV. An exposure dose is normally 5 kGy to 100 kGy, and preferably 10 kGy to 75 kGy. The electron ray irradiation is normally carried out in an inert gas. Alternatively, the electron ray irradiation can be carried out in air or in an inert gas to which oxygen has been slightly introduced.

An ultraviolet irradiation intensity is normally 10 mW/cm$^2$ to 5,000 mW/cm$^2$. The ultraviolet irradiation intensity is preferably in a wavelength region which is effective for activation of the cation polymerization initiator or the radical polymerization initiator. In a case where irradiation is carried out once or a plurality of times at such an ultraviolet irradiation intensity, an accumulated light intensity thereof becomes 10 mJ/cm$^2$ to 3,000 mJ/cm$^2$, preferably 50 mJ/cm$^2$ to 2,000 mJ/cm$^2$, and more preferably 100 mJ/cm$^2$ to 1,000 mJ/cm$^2$. In a case where the accumulated light intensity is less than the above range, the polymerizable liquid crystal compound may be insufficiently hardened, and therefore a good transferring property may not be achieved. Meanwhile, in a case where the accumulated light intensity is more than the above range, an optical film including the liquid crystal cured film may be colored.

Examples of a light source of an ultraviolet ray include a low-pressure mercury lamp, a medium-pressure mercury lamp, a high-pressure mercury lamp, an ultra-high-pressure mercury lamp, a xenon lamp, a halogen lamp, a carbon arc lamp, a tungsten lamp, a gallium lamp, an excimer laser, an LED light source which emits light having a wavelength of 380 nm to 440 nm, a chemical lamp, a black light lamp, a microwave excitation mercury lamp, a metal halide lamp, and the like.

Examples of the solvent include water; alcohols such as methanol, ethanol, isopropyl alcohol, 1-butanol, 2-butanol, sec-butyl alcohol, tert-butyl alcohol, ethylene glycol, propylene glycol, and butanediol; saturated aliphatic ether compounds such as propyl ether, isopropyl ether, butyl ether, isobutyl ether, n-amyl ether, isoamyl ether, methyl butyl ether, methyl isobutyl ether, methyl n-amyl ether, methyl isoamyl ether, ethyl propyl ether, ethyl isopropyl ether, ethyl butyl ether, ethyl isobutyl ether, ethyl n-amyl ether, and ethyl isoamyl ether; unsaturated aliphatic ether compounds such as aryl ether and ethyl aryl ether; aromatic ether compounds such as anisole, phenetole, phenyl ether, and benzyl ether; cyclic ether compounds such as tetrahydrofuran, tetrahydropyran, and dioxane; ethylene glycol ether compounds such as ethylene glycol monomethyl ether, ethylene glycol monoethyl ether, ethylene glycol monobutyl ether, diethylene glycol monomethyl ether, diethylene glycol monoethyl ether, and diethylene glycol monobutyl ether; monocarboxylic acid compounds such as formic acid, acetic acid, acetic anhydride, acrylic acid, citric acid, propionic acid, and butyric acid; organic acid ester compounds such as butyl formate, amyl formate, propyl acetate, isopropyl acetate, butyl acetate, secondary butyl acetate, amyl acetate, isoamyl acetate, 2-ethylhexyl acetate, cyclohexyl acetate, butyl cyclohexyl acetate, ethyl propionate, butyl propionate, amyl propionate, butyl butyrate, diethyl carbonate, diethyl oxalate, methyl lactate, ethyl lactate, butyl lactate, and triethyl phosphate; ketone compounds such as acetone, ethyl ketone, propyl ketone, butyl ketone, methyl isopropyl ketone, methyl isobutyl ketone, diisobutyl ketone, acetylacetone, diacetone alcohol, cyclohexanone, cyclopentanone, methylcyclohexanone, cycloheptanone; dicarboxylic acid compounds such as succinic acid, glutaric acid, adipic acid, undecanedioic acid, pyruvic acid, and citraconic acid; 1,4-dioxane; furfural; N-methylpyrrolidone; and the like.

Among those solvents, it is preferable to employ water and alcohol, it is more preferable to employ C1-C4 alcohol, it is still more preferable to employ at least one alcohol selected from the group consisting of methanol, ethanol, isopropyl alcohol, 1-butanol, 2-butanol, sec-butyl alcohol, tert-butyl alcohol, ethylene glycol, propylene glycol, and butanediol, and it is particularly preferable to employ isopropyl alcohol and/or 1-butanol.

The water can be pure water or can contain impurities to an extent equivalent to an extent to which tap water contains impurities.

A thickness of an adhesive agent layer formed from the active energy ray curing adhesive agent is normally 0.001 μm to 5 μm, preferably not less than 0.01 μm. The thickness is preferably not more than 2 μm, and more preferably not more than 1 μm. In a case where the adhesive agent layer formed from the active energy ray curing adhesive agent is excessively thick, appearance of the liquid crystal cured film is more likely to become defective.

[Transfer Receiving Body]

As a transfer receiving body, a polarizer or a polarizing plate can be used to prepare a laminated body for use in production of the circularly polarizing plate. Note that a transfer receiving body different from the polarizer or the polarizing plate (e.g., a transfer receiving body made of a material identical with that of the base material, or the like) can be used to prepare a laminated body for use in production of a product different from the circularly polarizing plate (e.g., a polarizing plate provided with an optical compensation layer, or the like).

[Polarizer and Polarizing Plate]

The polarizer has a polarizing function. Examples of the polarizer include a stretched film which has been caused to adsorb a pigment having absorption anisotropy; a film to which a pigment having absorption anisotropy has been applied; and the like. The pigment having absorption anisotropy can be a dichroic pigment.

The stretched film which has adsorbed a pigment having absorption anisotropy is normally produced through the steps of (i) uniaxially stretching a polyvinyl alcohol resin film, (ii) causing the polyvinyl alcohol resin film to adsorb a dichroic pigment by dyeing the polyvinyl alcohol resin film with the dichroic pigment, (iii) treating, with a boric acid aqueous solution, the polyvinyl alcohol resin film which has adsorbed the dichroic pigment, and (iv) washing the polyvinyl alcohol resin film with water after the polyvinyl alcohol resin film has been treated with the boric acid aqueous solution.

The dichroic pigment can be iodine or a dichroic organic dye. Examples of the dichroic organic dye include a dichroic direct dye which is made of a disazo compound such as C.I. DIRECT RED 39; a dichroic direct dye made of a compound such as a trisazo compound or a tetrakisazo compound; and the like.

The polarizer which has been obtained as above described, i.e., by subjecting the polyvinyl alcohol resin film to uniaxial stretching, dyeing with the dichroic pigment, boric acid treatment, washing with water, and drying has a thickness preferably of 5 µm to 40 µm.

Examples of the film to which a pigment having absorption anisotropy has been applied include a film which has been obtained by applying a composition that contains a dichroic pigment having liquid crystallinity; a film which has been obtained by applying a composition that contains a dichroic pigment and a polymerizable liquid crystal compound; and the like.

The film to which a pigment having absorption anisotropy has been applied is preferably thin. Note, however, that, in a case where the film to which a pigment having absorption anisotropy has been applied is excessively thin, strength of the film tends to decrease, and processability of the film tends to be deteriorated. A thickness of the film is normally not more than 20 µm, preferably not more than 5 µm, and more preferably 0.5 µm to 3 µm.

The film to which a pigment having absorption anisotropy has been applied can specifically be a film disclosed in Japanese Patent Application Publication, Tokukai, No. 2012-33249 or the like.

The polarizing plate can be obtained by laminating a transparent protective film on at least one surface of the polarizer via an adhesive agent. The transparent protective film is preferably a transparent film which is similar to the foregoing base material.

[Method for Producing Liquid Crystal Cured Film]

A method for producing the liquid crystal cured film of the present invention generally includes the following steps (i) and (ii):

(i) the step of, by adding another component to a polymerizable liquid crystal compound and further adding a solvent to the polymerizable liquid crystal compound to which the another component has been added, preparing a liquid composition for liquid crystal cured film formation which liquid composition contains the polymerizable liquid crystal compound; and (ii) the step of producing a liquid crystal cured film by applying the liquid composition for liquid crystal cured film formation to a base material or to an alignment film provided on the base material, and polymerizing the polymerizable liquid crystal compound.

Specifically, the step (ii) can be carried out by applying the composition for liquid crystal cured film formation to the surface of the base material or a surface of the alignment film formed on the base material, removing the solvent contained in the composition for liquid crystal cured film formation, polymerizing the polymerizable liquid crystal compound contained in the composition for liquid crystal cured film formation, and curing the composition for liquid crystal cured film formation. The step (ii) is described below in detail.

As a method for applying the composition for liquid crystal cured film formation to the surface of the base material or a surface of the alignment film formed on the base material, and as a method for applying the alignment polymer composition to the base material, a known method can be employed. Examples of the known method include: application methods such as spin coating, extrusion, gravure coating, die coating, bar coating, and an applicator method; and printing methods such as flexography. A thickness of the composition for liquid crystal cured film formation which composition is applied to the surface of the base material or the surface of the alignment film is determined in consideration of the thickness of the liquid crystal cured film to be obtained.

Next, the solvent contained in the composition for liquid crystal cured film formation is removed under a condition that the polymerizable liquid crystal compound is not polymerized. As a result, a dry film of the composition for liquid crystal cured film formation is formed on the surface of the base material or the surface of the alignment film. Examples of a method for removing the solvent include natural drying, draught drying, drying by heating, and drying under reduced pressure.

The dry film is, for example, heated so that the polymerizable liquid crystal compound contained in the dry film is subjected to liquid crystal alignment. The dry film is then irradiated with light while the liquid crystal alignment is retained. This causes the polymerizable liquid crystal compound to be polymerized.

Examples of a light source that emits light with which the dry film is irradiated include a xenon lamp, a high pressure mercury lamp, an extra-high pressure mercury lamp, a metal halide lamp, and an ultraviolet light laser such as KrF or ArF. Out of those examples, a high pressure mercury lamp, an extra-high pressure mercury lamp, or a metal halide lamp is preferably used.

The light source and the light with which the dry film is irradiated are each selected as appropriate depending on a kind of the photopolymerization initiator contained in the dry film or a kind of the polymerizable liquid crystal compound (especially, a kind of a polymerizable group in the polymerizable liquid crystal compound) and on an amount thereof. The light with which the dry film is irradiated preferably includes (i) light having a wavelength of less than 350 nm and (ii) light having a wavelength of not less than 350 nm. The polymerizable liquid crystal compound tends to be cured more sufficiently with use of such light.

The light is preferably ultraviolet light because a progress of a polymerization reaction can be easily controlled and because light widely used in the present field for polymerization can be used. Therefore, the respective kinds of the polymerizable liquid crystal compound and the photopolymerization initiator, each of which is contained in the composition for liquid crystal cured film formation, are preferably selected so that the polymerizable liquid crystal compound is polymerized by ultraviolet light. The polymerizable liquid crystal compound is preferably polymerized by irradiation with ultraviolet light while a polymerization temperature is being controlled by cooling of the dry film with use of suitable cooling means. In a case where the polymerizable liquid crystal compound is polymerized at a lower temperature by such cooling, it is possible to properly produce the liquid crystal cured film even when a material having low heat resistance is used as the base material.

The liquid crystal cured film having the liquid crystal alignment is thus formed on the surface of the base material or the surface of the alignment film.

[Primer Layer]

A primer layer, made of a transparent resin such as an epoxy resin, can be provided between the liquid crystal cured film or the alignment film and the adhesive agent layer.

[Second Adhesive Agent Layer]

The second adhesive agent layer is made of a single adhesive agent of which the first adhesive agent layer is made. The second adhesive agent layer is formed by applying an adhesive agent to a surface of the liquid crystal cured film, a surface of the alignment film, or a surface of the primer layer. In a case where the adhesive agent contains a solvent, the second adhesive agent layer is formed by (i) applying the adhesive agent to the surface of the liquid crystal cured film or the surface of the primer layer and (ii) removing the solvent. The second adhesive agent layer formed from a pressure-sensitive adhesive can be also formed by a method in which: the adhesive is applied to a surface of a film which surface is subjected to mold releasing treatment; a solvent is removed so that the adhesive agent layer is formed on the surface of the film; the film, on the surface of which the adhesive agent layer is formed, is bonded to the surface of the liquid crystal cured film or the surface of the primer layer so that the adhesive agent layer is bonded to the surface of the liquid crystal cured film or the surface of the primer layer. In addition, it is possible to further increase adhesion between the liquid crystal cured film or the primer layer and the second adhesive agent layer by carrying out corona treatment.

As a method for applying the adhesive agent to the surface of the liquid crystal cured film, the surface of the primer layer, or the surface of the film which surface is subjected to mold releasing treatment, it is possible to employ a method identical to that taken as an example of the method for applying the alignment polymer composition to the base material. As a method for removing the solvent from the adhesive agent applied to the surface of the liquid crystal cured film, the surface of the primer layer, or the surface of the film which surface is subjected to mold releasing treatment, it is possible to employ a method identical to the method for removing the solvent from the alignment polymer composition.

Embodiment 4: Display Device

The present invention can be a display device (e.g., an organic electroluminescent (EL) display device, a touch panel display device, or the like) including the circularly polarizing plate in accordance with Embodiment 3 of the present invention.

[Application of Liquid Crystal Cured Film and Circularly Polarizing Plate]

The liquid crystal cured film in accordance with Embodiment 1 of the present invention and the circularly polarizing plate in accordance with Embodiment 3 of the present invention can be used for various display devices.

A display device is a device including: a display element; and a light emitting element or a light emitting device serving as a light emitting source. Examples of the display device include a liquid crystal display device, an organic electroluminescent (EL) display device, an inorganic electroluminescent (EL) display device, a touch panel display device, an electron emission display device (a field emission display device (e.g., FED), a surface-conduction electron-emitter display device (SED)), electronic paper (a display device which employs electronic ink or an electrophoretic element), a plasma display device, projection display devices (e.g., a grating light valve (GLV) display device and a display device including a digital micromirror device (DMD)), a piezoelectric ceramic display, and the like. The liquid crystal display device includes all the following display devices: a transmissive liquid crystal display device, a semi-transmissive liquid crystal display device, a reflective liquid crystal display device, a direct-view liquid crystal display device, a projection liquid crystal display device, and the like. Each of those display devices can be a display device which displays a two-dimensional image or can be a stereoscopic display device which displays a three-dimensional image. Particularly, the circularly polarizing plate can be effectively used for the organic electroluminescent (EL) display device and the inorganic electroluminescent (EL) display device, and an optical compensation polarizing plate can be effectively used for the liquid crystal display device and the touch panel display device.

EXAMPLES

The present invention will be described below in more detail with reference to Examples, Comparative Examples, and Reference Examples. Note that "%" and "part(s)" in Examples and Comparative Examples mean "mass %" and "part(s) by mass," respectively, if not otherwise specified.

Polymer films, devices, and measurement methods used in Examples, Comparative Examples, and Reference Examples were as follows.

ZF-14, manufactured by Zeon Corporation, was used as a cycloolefin polymer (COP) film.

AGF-B10, manufactured by Kasuga Electric Works Ltd., was used as a corona treatment device.

Corona treatment was carried out once with use of the above corona treatment device under conditions of (i) output of 0.3 kW and (ii) a treatment speed of 3 m/min.

SPOT CURE SP-7 equipped with a polarizer unit, manufactured by Ushio Inc., was used as a polarized UV light irradiation device.

LEXT, manufactured by Olympus Corporation, was used as a laser microscope.

Unicure VB-15201BY-A, manufactured by Ushio Inc., was used as a high pressure mercury lamp.

KOBRA-WR, manufactured by Oji Scientific Instruments Co., Ltd., was used to measure an in-plane phase difference value.

An ellipsometer M-220, manufactured by JASCO Corporation, was used to measure a thickness of a film.

Model 670-IR, manufactured by Agilent Technologies, was used to measure an infrared total reflection absorption spectrum.

Example 1

[Preparation of Composition for Photoalignment Film Formation]

Five parts of a photoalignment material having the following structure, and 95 parts of cyclopentanone (solvent) were mixed together as components. A resultant mixture was stirred at 80° C. for 1 (one) hour to obtain a composition for photoalignment film formation (1). The photoalignment material was synthesized in accordance with a method described in Japanese Patent Application Publication, Tokukai, No. 2013-33248.

[Chem. 3]

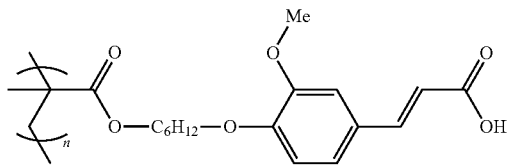

[Preparation of Composition Containing Polymerizable Liquid Crystal Compound]

Polymerizable liquid crystal A having the following structure, a polyacrylate compound (leveling agent) (BYK-361N; manufactured by BYK Chemie), and a photopolymerization initiator below were mixed together as components to obtain a composition (1) containing a polymerizable liquid crystal compound.

[Chem. 4]

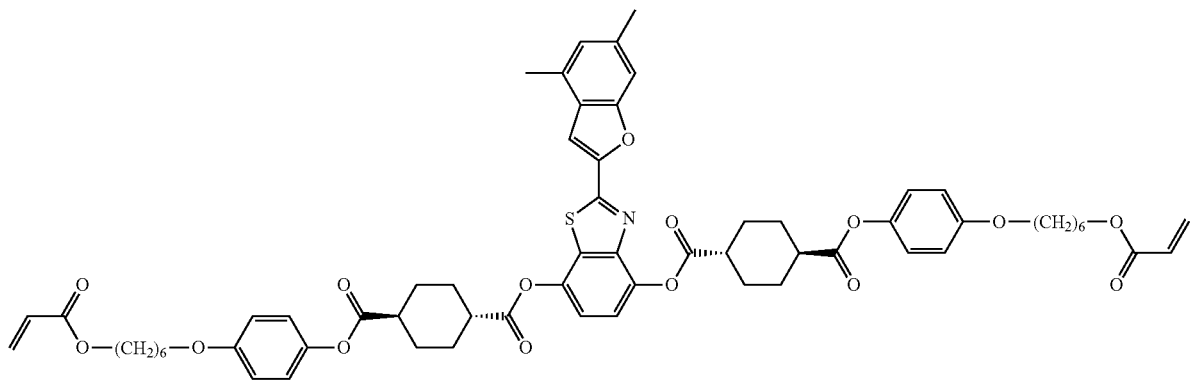

The polymerizable liquid crystal A was synthesized by a method disclosed in Japanese Patent Application Publication, Tokukai, No. 2010-31223. A wavelength $\lambda_{max}(LC)$ at which the polymerizable liquid crystal A had a maximum absorption was 350 nm.

An amount of the polyacrylate compound was 0.01 parts, relative to 100 parts of the polymerizable liquid crystal A.

The photopolymerization initiator was selected from the following four kinds of polymerization initiators. In each of Examples, Comparative Examples, and Reference Examples, the photopolymerization initiator shown in the following Table 1 was added in an amount shown in Table 1 with respect to 100 parts of the polymerizable liquid crystal A. Note that Table 1 also shows a maximum absorption at wavelength λ(A) and a maximum absorption at wavelength λ(B) of each of the photopolymerization initiators.

Irgacure OXE-03 (manufactured by BASF Japan Ltd.)
ADEKA ARKLS NCI-831 (manufactured by ADEKA CORPORATION)
2-dimethylamino-2-benzil-1-(4-morpholinophenyl) butane-1-one (Irgacure 369 (Irg369); manufactured by BASF Japan Ltd.)
2,2-dimethoxy-1,2-diphenylethane-1-one (Irgacure 651 (Irg 651); manufactured by BASF Japan Ltd.)

[Production of Polarizing Plate]

A polyvinyl alcohol film having a thickness of 75 μm, an average degree of polymerization of approximately 2,400, and a degree of saponification of 99.9 mol % or higher was immersed in pure water at 30° C., and then the polyvinyl alcohol film was immersed in an aqueous solution which contained iodine/potassium iodide/water at a weight ratio of 0.02/2/100 and was at a temperature of 30° C. Thus, the polyvinyl alcohol film was subjected to iodine stain (iodine stain step). The polyvinyl alcohol film which had been subjected to the iodine stain step was then immersed in an aqueous solution which contained potassium iodide/boric acid/water at a weight ratio of 12/5/100 and was at a temperature of 56.5° C., and thus the polyvinyl alcohol film was subjected to boric acid treatment (boric acid treatment step). The polyvinyl alcohol film which had been subjected to the boric acid treatment step was washed with pure water at 8° C. and then dried at 65° C. Thus, a polarizer (having a thickness of 27 μm after stretching) was obtained in which iodine was adsorbed on polyvinyl alcohol while being aligned. In this case, the polyvinyl alcohol film was stretched in the iodine stain step and the boric acid treatment step. A total stretch magnification in the stretching was 5.3 times. The polarizer thus obtained was (i) sandwiched between two triacetylcellulose films (manufactured by KONICA MINOLTA JAPAN, INC.; KC4UY TAC: 40 μm) which had been subjected to saponification treatment and (ii) bonded to the triacetylcellulose films via a water-based adhesive agent with use of nip rollers. While a tension of a laminated film thus obtained was kept at 430 N/m, the laminated film was dried at 60° C. for 2 minutes, and thus a polarizing plate (1) having triacetylcellulose films (i.e., protective films) on both surfaces thereof was obtained.

Note that the water-based adhesive agent was prepared by adding 3 parts of carboxyl group modified polyvinyl alcohol (manufactured by KURARAY CO., LTD.; KURARAY POVAL KL318) and 1.5 parts of water-soluble polyamide epoxy resin (manufactured by Sumika Chemtex Company, Limited; Sumireds Resin 650; aqueous solution having solid content concentration of 30%) to 100 parts of water.

[Production of Liquid Crystal Cured Film]

N-methyl-2-pyrolidone (NMP) was added to the composition (1) containing the polymerizable liquid crystal compound (described earlier) so that a solid content concentration became 13%, and a resultant mixture was stirred at 80° C. for 1 (one) hour. Thus, a coating liquid was obtained.

Meanwhile, a cycloolefin polymer (COP) film serving as a base material was subjected to corona treatment with use of a corona treatment device. Subsequently, the composition for photoalignment film formation (1) (described earlier) was (i) applied, with use of a bar coater, to a surface of the COP film (base material) which surface had been subjected to the corona treatment and (ii) dried at 80° C. for 1 (one) minute. Then, polarized UV exposure was carried out at an accumulated light intensity of 100 mJ/cm$^2$ with use of a polarized UV light irradiation device, so that an alignment film was obtained. A film thickness of the obtained alignment film was 100 nm.

Subsequently, the coating liquid (described earlier) was applied to the alignment film with use of a bar coater and dried at 120° C. for 1 (one) minute. Then, the coating liquid was irradiated, with use of a high pressure mercury lamp, with an ultraviolet ray (in a nitrogen atmosphere, wavelength: 313 nm, accumulated light intensity at wavelength of 313 nm: 250 mJ/cm$^2$ or 500 mJ/cm$^2$) from a side of a surface of the alignment film on which surface the coating liquid was applied. Thus, a liquid crystal cured film was formed. Further, an optical film including the liquid crystal cured film was formed. In addition, a polarizing plate serving as a transfer receiving body was subjected to corona treatment with use of a corona treatment device. The liquid crystal cured film obtained had a maximum absorption at a wavelength of 350 nm.

An adhesive agent layer was bonded to the formed optical film, and then the liquid crystal cured film was bonded via the adhesive agent layer to the polarizing plate (transfer receiving body) which had been subjected to the corona treatment. In this case, the polarizing plate and the liquid crystal cured film were laminated such that an absorption axis of the polarizing plate and a slow axis of the liquid crystal cured film intersect at 45°. Then, the COP film serving as the base material was peeled, and thus a circularly polarizing plate (1) in which the liquid crystal cured film had been transferred to the polarizing plate serving as the transfer receiving body was obtained. In this case, the liquid crystal cured film is the only layer that had been transferred to the polarizing plate, and the alignment film remained on the COP film serving as the base material.

In-plane phase difference values of the obtained circularly polarizing plate (1) were measured with respect to light having respective wavelengths of 450 nm, 550 nm, and 650 nm. As a result of the measurement, the in-plane phase difference values at the respective wavelengths were as follows: that is, Re(450)=121 nm, Re(550)=139 nm, and Re(650)=142 nm, and a relationship among the in-plane phase difference values at the respective wavelengths was as follows:

$Re(450)/Re(550)=0.87$ $Re(650)/Re(550)=1.02$ wherein: Re(450) represents an in-plane phase difference value with respect to light having a wavelength of 450 nm; Re(550) represents an in-plane phase difference value with respect to light having a wavelength of 550 nm; and Re(650) represents an in-plane phase difference value with respect to light having a wavelength of 650 nm.

That is, the liquid crystal cured film had an optical characteristic represented by the following Formulae (1), (2), and (3). Note that an in-plane phase difference value of the polarizing plate at a wavelength of 550 nm is approximately 0 (zero). Therefore, the in-plane phase difference value of the polarizing plate does not affect the optical characteristic represented by the following Formulae (1) through (3):

$$Re(450)/Re(550) \leq 1.00 \qquad (1)$$

$$1.00 \leq Re(650)/Re(550) \qquad (2)$$

$$100 \text{ nm} < Re(550) < 160 \text{ nm} \qquad (3)$$

[Infrared Total Reflection Absorption Spectrum Measurement]

The adhesive agent layer was provided on a surface of surfaces of the liquid crystal cured film (described earlier) each of which surfaces is perpendicular to a thickness direction of the liquid crystal cured film, the surface being opposite from the photoalignment film side surface. Then, the liquid crystal cured film was bonded via the adhesive agent layer to the COP film (transfer receiving body) which had been subjected to the corona treatment. Thereafter, the COP film serving as the base material was peeled, so that a laminated body (1a) including the COP film (transfer receiving body), the adhesive agent layer, and the liquid crystal cured film which were provided in this order was obtained. The obtained laminated body (1a) was subjected to infrared total reflection absorption spectrum measurement (angle of incidence: 45°), and P' (a P value of a surface which has a smaller P value among P values of two surfaces which are perpendicular to a thickness direction of the liquid crystal cured film) was calculated from obtained results of the measurement (respective values of a peak intensity I(1) derived from in-plane deformation vibration (1408 cm$^{-1}$) of an ethylenic unsaturated bond and a peak intensity I(2) derived from stretching vibration (1504 cm$^{-1}$) of an unsaturated bond of an aromatic ring). Results of the calculation are shown in Table 1.

Further, a solution obtained by dissolving a polymerizable liquid crystal compound A in chloroform was dropped on germanium crystal and dried, so that a thin layer of the polymerizable liquid crystal compound A was obtained. The obtained thin layer was subjected to the infrared total reflection absorption spectrum measurement, and P0 (P value of the polymerizable liquid crystal compound) was calculated from obtained results of the measurement (peak intensity I(1) derived from in-plane deformation vibration (1408 cm$^{-1}$) of an ethylenic unsaturated bond=0.0113, peak intensity I(2) derived from stretching vibration (1504 cm$^{-1}$) of an unsaturated bond of an aromatic ring=0.0351), so that the polymerizable liquid crystal compound A had P0 of 0.322.

[Phase Difference Value Measurement During Heat-Resistance Test]

The adhesive agent layer (acrylic polymer-containing adhesive) and a glass base material were provided in this order on one of surfaces of the liquid crystal cured film (described earlier) each of which surfaces is perpendicular to a thickness direction of the liquid crystal cured film, the one being opposite from the photoalignment film side surface. Thereafter, the COP film serving as the base material was peeled, and then the adhesive agent layer and the COP film (transfer receiving body) which had been subjected to the corona treatment were bonded to the liquid crystal cured film in this order, so that a laminated body (1b) including the glass base material, the adhesive agent layer, the liquid crystal cured film, the adhesive agent layer, and the COP film (transfer receiving body) which were provided in this order was obtained. The obtained laminated body (1b) was put in an oven at 85° C., and after 500 hours, an in-plane phase difference value was measured, so that an amount of change in in-plane phase difference value between before and after the heat-resistance test (a change in in-plane phase difference value between before and after the heat-resistance test) was calculated.

Examples 2 through 12

Examples 2 through 12 obtained compositions (2) through (12) each containing a polymerizable liquid crystal compound, circularly polarizing plates (2) through (12), laminated bodies (2a) through (2a), and laminated bodies (2b) through (12b) by carrying out operations similar to those carried out in Example 1, except that a type and an amount of a polymerization initiator to be added and an accumulated amount of ultraviolet rays (ultraviolet irradiation energy at a wavelength of 313 nm) were changed as shown in Table 1. All obtained liquid crystal cured films had a maximum absorption at a wavelength of 350 nm. Further, as in the case of Example 1, Examples 2 through 12 measured and calculated in-plane phase difference values of the circularly polarizing plates at a wavelength of 450 nm and a wavelength of 650 nm, infrared total reflection absorption spectra of the laminated bodies, in-plane phase difference values, and amounts of change in in-plane phase difference value between before and after a heat-resistance test of the laminated bodies. Results of the measurement and the calculation are shown in Table 1.

Comparative Examples 1 and 2

Comparative Examples 1 and 2 obtained comparative compositions (1) and (2) each containing a polymerizable liquid crystal compound, comparative circularly polarizing plates (1) and (2), and comparative laminated bodies (1) and (2) by carrying out operations similar to those carried out in Example 1, except that a type and an amount of a polymerization initiator to be added were changed as shown in Table 1. All obtained liquid crystal cured films had a maximum absorption at a wavelength of 350 nm. Further, as in the case of Example 1, Comparative Examples 1 and 2 measured and calculated in-plane phase difference values of the comparative circularly polarizing plates at a wavelength of 450 nm and a wavelength of 650 nm, infrared total reflection absorption spectra of the comparative laminated bodies, in-plane phase difference values, and amounts of change in in-plane phase difference value between before and after a heat-resistance test of the comparative laminated bodies. Results of the measurement and the calculation are shown in Table 1.

Reference Example 1

Reference Example 1 obtained a reference composition (1) containing a polymerizable liquid crystal compound, a reference circularly polarizing plate (1), and a reference laminated body (1) by carrying out operations similar to those carried out in Example 1, except that a type and an amount of a polymerization initiator to be added were changed as shown in Table 1. An obtained liquid crystal cured film had a maximum absorption at a wavelength of 350 nm. Further, as in the case of Example 1, Reference Example 1 measured and calculated in-plane phase difference values of the reference circularly polarizing plate at a wavelength of 450 nm and a wavelength of 650 nm, an infrared total reflection absorption spectrum of the reference laminated body, an in-plane phase difference value, and an amount of change in in-plane phase difference value between before and after a heat-resistance test of the reference laminated body. Results of the measurement and the calculation are shown in Table 1.

Reference Example 2

Reference Example 2 obtained a reference composition (2) containing a polymerizable liquid crystal compound, a reference circularly polarizing plate (2), and a reference laminated body (2) by carrying out operations similar to those carried out in Example 1, except that a type and an amount of a polymerization initiator to be added were changed as shown in Table 1. An obtained liquid crystal cured film had a maximum absorption at a wavelength of 350 nm. Further, as in the case of Example 1, Reference Example 1 measured and calculated in-plane phase difference values of the reference circularly polarizing plate at a wavelength of 450 nm and a wavelength of 650 nm, an infrared total reflection absorption spectrum of the reference laminated body, an in-plane phase difference value, and an amount of change in in-plane phase difference value between before and after a heat-resistance test of the reference laminated body. Results of the measurement and the calculation are reveal that Re(450)/Re(550) had a value (wavelength variance) of 0.93 and the value would change performance of an in-plane phase difference of a circularly polarizing plate to be obtained. The other results are shown in Table 1.

TABLE 1

| | Amount of initiator added (part by mass) | | | | 313 nm ultraviolet irradiation energy | | | Change in phase difference value at wavelength of 550 nm |
|---|---|---|---|---|---|---|---|---|
| | OXE-03 | NCI-831 | Irg369 | Irg651 | (mJ/cm$^2$) | P' | (1 − P'/P0) × 100 | during heat-resistance test |
| Maximum absorption at wavelength λ(A)/nm | 305 | 300 | 320 | 330 | | | | |
| Maximum absorption at wavelength λ(B)/nm | 355 | 370 | — | — | | | | |
| Example (1) | 7.5 | 3 | | | 500 | 0.057 | 83 | −3 nm |
| Example (2) | 10 | 3 | | | 500 | 0.055 | 83 | −2 nm |

TABLE 1-continued

| | Amount of initiator added (part by mass) | | | | 313 nm ultraviolet irradiation energy (mJ/cm$^2$) | P' | $(1 - P'/P0) \times 100$ | Change in phase difference value at wavelength of 550 nm during heat-resistance test |
|---|---|---|---|---|---|---|---|---|
| | OXE-03 | NCI-831 | Irg369 | Irg651 | | | | |
| Example (3) | 10 | 1 | 3 | | 500 | 0.054 | 84 | −2 nm |
| Example (4) | 12.5 | | 3 | | 500 | 0.053 | 84 | −2 nm |
| Example (5) | | 3 | | 15 | 500 | 0.072 | 78 | −3 nm |
| Example (6) | 7.5 | | 3 | | 250 | 0.071 | 78 | −4 nm |
| Example (7) | 10 | | 3 | | 250 | 0.066 | 80 | −3 nm |
| Example (8) | 10 | 1 | 3 | | 250 | 0.069 | 79 | −3 nm |
| Example (9) | 12.5 | | 3 | | 250 | 0.069 | 79 | −3 nm |
| Example (10) | | 3 | | 15 | 250 | 0.079 | 75 | −4 nm |
| Example (11) | 3 | | 3 | | 500 | 0.055 | 83 | −4 nm |
| Example (12) | 3 | | 3 | | 1000 | 0.024 | 93 | −3 nm |
| Comparative Example (1) | | | 6 | | 500 | 0.092 | 72 | −10 nm |
| Comparative Example (2) | | | 9 | | 500 | 0.116 | 64 | −15 nm |
| Reference Example (1) | 21 | | | | 500 | Unmeasurable due to occurrence of alignment defect | | |
| Reference Example (2) | 3 | | 3 | | 5000 | 0.008 | 97 | −2 nm Change in wavelength variance |

[Results]

A comparison between (a) Examples 1 through 12 and (b) Comparative Examples 1 and 2 reveals that an amount of change in in-plane phase difference value between before and after the heat-resistance test was −10 nm (in Comparative Example 1) or −15 nm (in Comparative Example 2) and thus a change (decrease) in in-plane phase difference value was great, whereas in Examples 1 through 12, the amount of change in in-plane phase difference value between before and after the heat-resistance test ranged from −2 nm to −4 nm and thus the change in in-plane phase difference value was small.

Specifically, it is revealed that the liquid crystal cured films whose $(1-P'/P0)\times 100$ had a value of not less than 73 (75 to 93 in Examples 1 through 12) is smaller in change in in-plane phase difference value between before and after the heat-resistance test than the liquid crystal cured films whose $(1-P7P0)\times 100$ had a value of less than 73 (72 in Comparative Example 1, and 64 in Comparative Example 2), and thus the liquid crystal cured films of Examples 1 through 12 make it possible to reduce an amount of decrease in phase difference value which decrease is caused in a case where the liquid crystal cured films are exposed to a high-temperature environment.

INDUSTRIAL APPLICABILITY

A liquid crystal cured film to be obtained by polymerizing and curing a polymerizable liquid crystal compound of the present invention and an optical film including the liquid crystal cured film make it possible to reduce an amount of decrease in in-plane phase difference which decrease is caused in a case where the liquid crystal cured film and the optical film are exposed to a high-temperature environment. A liquid crystal cured film of the present invention and an optical film of the present invention can be widely used in, for example, display devices such as an organic electroluminescent (EL) display device and a touch panel display device.

The invention claimed is:

1. A liquid crystal cured film comprising a composition which contains a polymerizable liquid crystal compound and a photopolymerization initiator composition containing two or more photopolymerization initiators and which is cured, an amount in which the polymerizable liquid crystal compound is contained in 100 parts by mass of a solid content of the composition being 70 parts by mass to 99.5 parts by mass, the photopolymerization initiator composition containing a photopolymerization initiator that has an oxime structure in a molecule thereof, said liquid crystal cured film having a maximum absorption at a wavelength in a range of not less than 300 nm and not more than 380 nm, and satisfying the following Formula (Y):

$$(1-P'/P0)\times 100 \geq 73 \qquad (Y)$$

wherein: P' represents a P value of a surface which has a smaller P value among P values of two surfaces which are perpendicular to a thickness direction of the liquid crystal cured film; P0 represents the P value of the polymerizable liquid crystal compound; and the P value is represented by $I(1)/I(2)$, wherein $I(1)$ represents a peak intensity derived from in-plane deformation vibration of an ethylenic unsaturated bond obtained by infrared total reflection absorption spectrum measurement and $I(2)$ represents a peak intensity derived from stretching vibration of an unsaturated bond of an aromatic ring obtained by the infrared total reflection absorption spectrum measurement, said liquid crystal cured film satisfying the following Formulae (1) and (2):

$$Re(450)/Re(550) \leq 1.00 \qquad (1)$$

$$1.00 \leq Re(650)/Re(550) \qquad (2)$$

wherein: Re(450) represents an in-plane phase difference value with respect to light having a wavelength of 450 nm; Re(550) represents an in-plane phase difference value with respect to light having a wavelength of 550 nm; and Re(650) represents an in-plane phase difference value with respect to light having a wavelength of 650 nm; and wherein the polymerizable liquid crystal compound has a maximum absorption at wavelength $\lambda_{max}(LC)$ that satisfies the following:

$$300 \text{ nm} \leq \lambda_{max}(LC) \leq 380 \text{ nm}.$$

2. The liquid crystal cured film as set forth in claim 1, wherein the liquid crystal cured film satisfies the following Formula (3):

$$100 \text{ nm} < Re(550) < 160 \text{ nm} \quad (3)$$

wherein Re(550) represents an in-plane phase difference value with respect to light having a wavelength of 550 nm.

3. The liquid crystal cured film as set forth in claim 1, wherein the photopolymerization initiator composition has a maximum absorption at wavelength $\lambda(A)$ and a maximum absorption at wavelength $\lambda(B)$ and these maximum absorptions at wavelength $\lambda(A)$ and $\lambda(B)$ satisfy the following:

$$\lambda(A) < \lambda(B).$$

4. The liquid crystal cured film as set forth in claim 3, wherein the maximum absorption at the wavelength of the photopolymerization initiator composition and the maximum absorption at the wavelength of the polymerizable liquid crystal compound satisfy the following:

$$20 \text{ nm} < \lambda(B) - \lambda_{max}(LC) \text{ or}$$

$$20 \text{ nm} < \lambda_{max}(LC) - \lambda(A).$$

5. The liquid crystal cured film as set forth in claim 1, wherein the liquid crystal cured film contains the photopolymerization initiator composition in an amount of 1 part by mass to 20 parts by mass relative to 100 parts by mass of the polymerizable liquid crystal compound.

6. An optical film comprising a liquid crystal cured film recited in claim 1.

7. A circularly polarizing plate comprising:
a liquid crystal cured film recited in claim 1; and
a polarizing plate.

8. An organic electroluminescent (EL) display device comprising a liquid crystal cured film recited in claim 1.

9. A touch panel display device comprising a liquid crystal cured film recited in claim 1.

* * * * *